United States Patent
Taki et al.

(10) Patent No.: US 11,934,098 B2
(45) Date of Patent: Mar. 19, 2024

(54) DETECTION APPARATUS, LITHOGRAPHY APPARATUS, AND ARTICLE MANUFACTURING METHOD

(71) Applicant: CANON KABUSHIKI KAISHA, Tokyo (JP)

(72) Inventors: Tomokazu Taki, Tochigi (JP); Toshiki Iwai, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/062,100

(22) Filed: Dec. 6, 2022

(65) Prior Publication Data
US 2023/0194980 A1    Jun. 22, 2023

(30) Foreign Application Priority Data
Dec. 20, 2021  (JP) ................... 2021-206257

(51) Int. Cl.
*G03F 9/00*   (2006.01)
*G03F 7/00*   (2006.01)

(52) U.S. Cl.
CPC .......... *G03F 7/0002* (2013.01); *G03F 9/7069* (2013.01); *G03F 9/7084* (2013.01); *G03F 9/7088* (2013.01)

(58) Field of Classification Search
CPC .... G03F 7/0002; G03F 9/7069; G03F 9/7084; G03F 9/7088
See application file for complete search history.

(56) References Cited

U.S. PATENT DOCUMENTS

| | | | |
|---|---|---|---|
| 2007/0146700 A1* | 6/2007 | Kowarz | G01J 3/02 356/310 |
| 2016/0363871 A1* | 12/2016 | Van Oosten | G03F 7/70625 |

FOREIGN PATENT DOCUMENTS

| | | |
|---|---|---|
| JP | 2012059853 A | 3/2012 |
| JP | 2019004143 A | 1/2019 |

\* cited by examiner

*Primary Examiner* — Mesfin T Asfaw
(74) *Attorney, Agent, or Firm* — ROSSI, KIMMS & McDOWELL LLP

(57) ABSTRACT

The present invention provides a detection apparatus for detecting a position of a detection target including a diffraction grating pattern, comprising: an illuminator configured to illuminate the detection target with illumination light including a plurality of wavelengths; a wavelength selector including an incident surface on which diffracted light from the detection target is incident, and configured to select light of a specific wavelength from the diffracted light; and a detector configured to receive the light of the specific wavelength selected by the wavelength selector and detect the position of the detection target, wherein positions on the incident surface where light components of the plurality of wavelengths included in the illumination light are incident are different from each other, and wherein the wavelength selector controls each of the plurality of elements in accordance with the position on the incident surface.

12 Claims, 17 Drawing Sheets

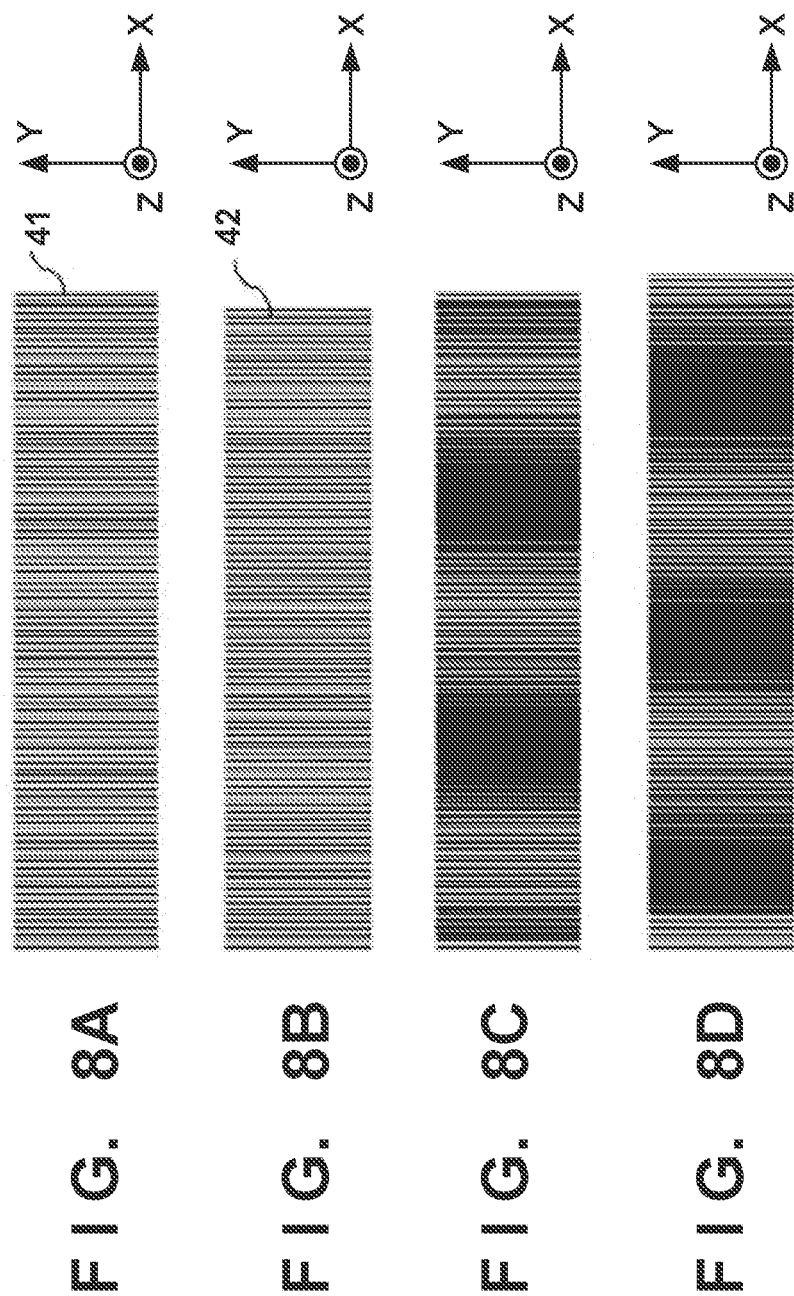

FIG. 10A
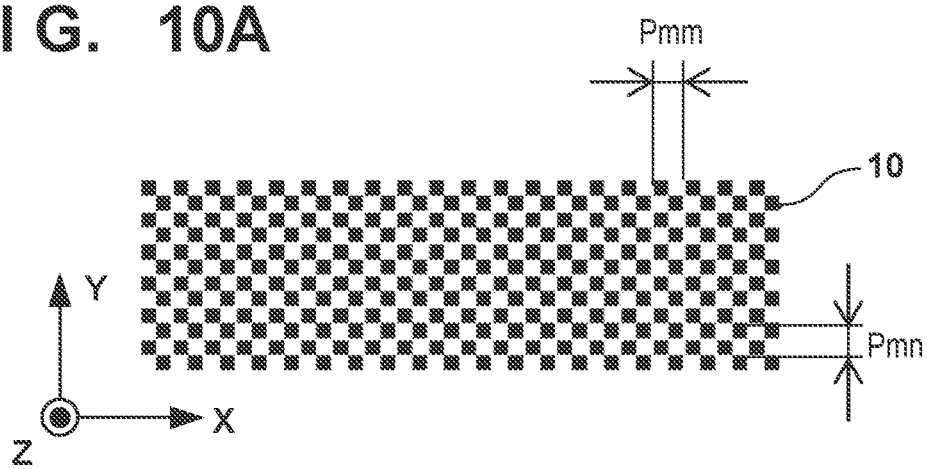
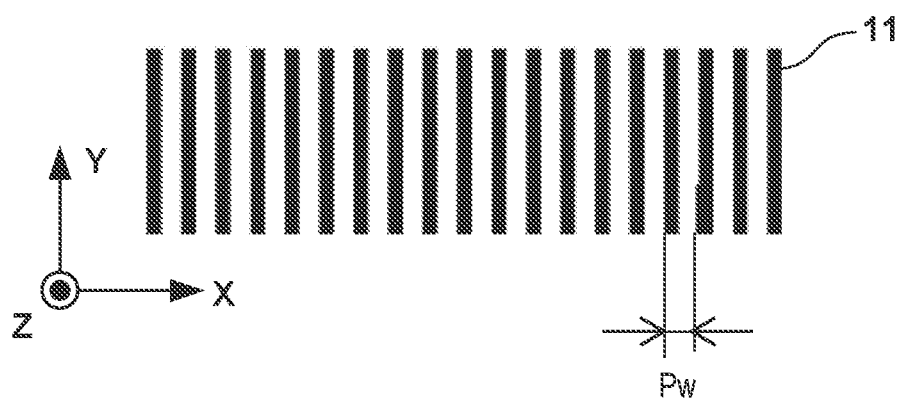
FIG. 10B

DETECTION APPARATUS, LITHOGRAPHY APPARATUS, AND ARTICLE MANUFACTURING METHOD

BACKGROUND OF THE INVENTION

Field of the Invention

The present invention relates to a detection apparatus, a lithography apparatus, and an article manufacturing method.

Description of the Related Art

To manufacture an article such as a semiconductor device, a lithography apparatus such as a projection exposure apparatus or an imprint apparatus is used. In the projection exposure apparatus, a shot region of a substrate and an original (reticle) are aligned with each other, and the pattern of the original is projected to the shot region of the substrate via a projection optical system, thereby forming a latent image pattern on a photoresist applied to the substrate. By developing the latent image pattern, a physical pattern is formed on the substrate. In the imprint apparatus, an imprint material is arranged on a shot region of a substrate, and the imprint material is cured in a state in which the imprint material and an original (mold) are in contact, thereby forming a pattern made of the cured product of the imprint material on the substrate.

When aligning the shot region of the substrate with the original, the relative position between the shot region and the original is detected. This detection can be done by detecting the relative position between a mark provided on the shot region and a mark provided on the original. In the projection exposure apparatus, for example, a box-in-box can be formed by the mark on the substrate side and the mark on the original side. In the imprint apparatus, for example, a moiré fringe can be formed by the mark on the substrate side and the mark on the original side. Japanese Patent Laid-Open No. 2012-59853 describes evaluating a detection error derived from a mark detection system and optimizing an illumination condition (for example, an illumination method such as an illumination numerical aperture or an illumination wavelength) based on the evaluation result.

Here, if a detection target such as a mark has an asymmetrical shape due to a manufacturing error (process error), an error may occur in the detection result of the position information of the mark. This error is called a wafer induced shift (WIS). Japanese Patent Laid-Open No. 2019-4143 describes, to reduce the WIS, adjusting the intensity of each of light components of a plurality of wavelengths in illumination light based on a wavelength characteristic representing the relationship between the wavelength of light to illuminate the detection target and the detection error of the detector such that the detection error of the detector is reduced. In Japanese Patent Laid-Open No. 2019-4143, the output of each of a plurality of light sources (semiconductor lasers) for emitting light components of wavelengths different from each other is adjusted, thereby adjusting the intensity of each of the light components of the plurality of wavelengths included in the illumination light.

The detection error of the detector can change in accordance with the position on the substrate where the detection target such as a mark is provided. Hence, the wavelength of light used to detect the position of the detection target is preferably changed in accordance with the position on the substrate where the detection target is provided such that the detection error is reduced. However, if the output of each of a plurality of light sources (semiconductor lasers) is adjusted as in the method described in Japanese Patent Laid-Open No. 2019-4143, considerable time is taken until the output of each light source stabilizes, resulting in disadvantage in terms of throughput (productivity).

SUMMARY OF THE INVENTION

The present invention provides, for example, a technique advantageous in implementing both detection accuracy and throughput when detecting the position of a detection target.

According to one aspect of the present invention, there is provided a detection apparatus for detecting a position of a detection target including a diffraction grating pattern, comprising: an illuminator configured to illuminate the detection target with illumination light including a plurality of wavelengths; a wavelength selector including an incident surface on which diffracted light from the detection target illuminated by the illuminator is incident, and configured to select light of a specific wavelength from the diffracted light; and a detector configured to receive the light of the specific wavelength selected by the wavelength selector and detect the position of the detection target, wherein a plurality of elements each of which switches light guide/nonguide of the diffracted light to the detector are two-dimensionally arrayed on the incident surface of the wavelength selector, wherein diffraction directions of light components of the plurality of wavelengths included in the illumination light on the detection target are different from each other, and positions on the incident surface of the wavelength selector where the light components are incident as the diffracted light are different from each other, and wherein the wavelength selector controls each of the plurality of elements in accordance with the position on the incident surface where the light of the specific wavelength is incident, thereby selecting the light of the specific wavelength from the diffracted light and guiding the light to the detector.

Further features of the present invention will become apparent from the following description of exemplary embodiments with reference to the attached drawings.

BRIEF DESCRIPTION OF THE DRAWINGS

FIGS. 8A to 8D are views showing examples of the configuration of a diffraction grating serving as a mark;

FIGS. 10A and 10B are views for explaining the detection principle of a moiré fringe;

DESCRIPTION OF THE EMBODIMENTS

Figure 1:
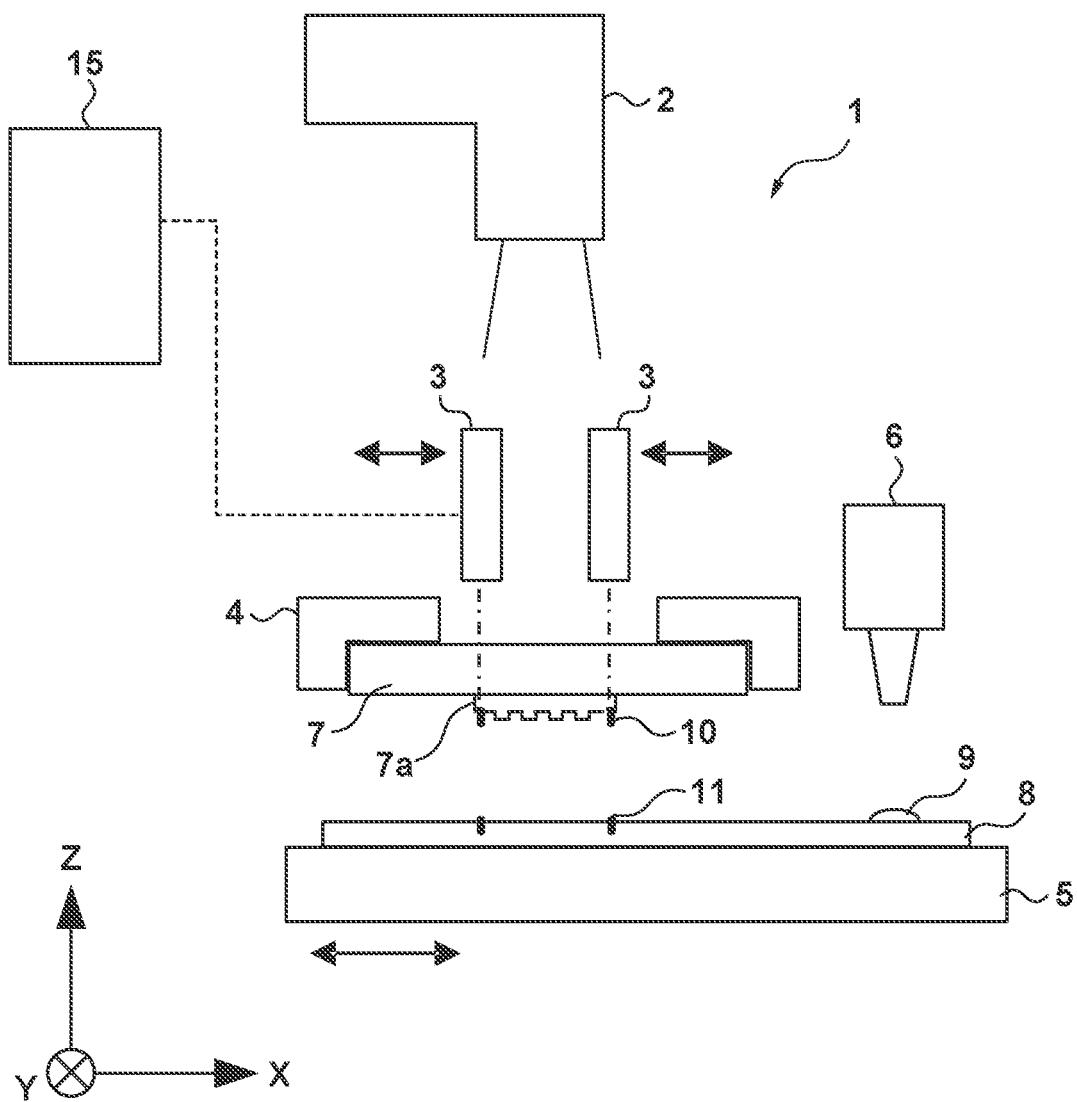
FIG. 1 is a view showing an example of the configuration of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In the following embodiments, as a lithography apparatus to which a detection apparatus according to the present invention is applied, an imprint apparatus that forms a pattern of an imprint material on a substrate using a mold serving as an original will exemplarily be described. However, the detection apparatus according to the present invention can also be applied to another lithography apparatus such as a projection exposure apparatus that, for example, projects the pattern of a reticle (mask) serving as an original onto a substrate via a projection optical system, thereby exposing the substrate.

First Embodiment

The first embodiment according to the present invention will be described. FIG. 1 shows an example of the configuration of an imprint apparatus 1 according to this embodiment. The imprint apparatus 1 is an apparatus that brings an imprint material 9 supplied onto a substrate 8 into contact with a mold 7 (pattern region 7a) and gives curing energy to the imprint material 9, thereby forming a pattern of a cured product to which the pattern with convex and concave portions of the mold 7 is transferred. More specifically, the imprint apparatus 1 arranges the imprint material 9 as a plurality of droplets on the substrate 8, and cures the imprint material 9 by light irradiation or the like in a state in which the mold 7 (pattern region 7a) having a pattern with convex and concave portions is in contact with the imprint material 9 on the substrate 8. When the imprint apparatus 1 then increases the interval between the mold 7 and the substrate 8 to separate the mold 7 from the cured imprint material 9, the pattern of the mold 7 is transferred to the imprint material 9 on the substrate, and a pattern made of the cured product of the imprint material 9 can be formed on the substrate. The series of processes is called "imprint processing", and is performed for each of a plurality of shot regions on the substrate.

The mold 7 is made of a material that transmits light (for example, UV rays) for curing the imprint material 9, for example, quartz, and the pattern with convex and concave portions, which should be transferred to the imprint material 9 on the substrate 8, is formed in a partial region (pattern region 7a) on the surface on the substrate side. The pattern region 7a has, for example, a mesa shape made of a step difference of about several tens of µm. Also, as the material of the substrate 8, for example, glass, ceramic, a metal, a semiconductor, a resin, or the like can be used. A member made of a material different from that of the substrate may be provided on the surface of the substrate 8, as needed. In this embodiment, the substrate 8 is, for example, a silicon wafer, a compound semiconductor wafer, or silica glass.

As the imprint material, a curable composition (to be also referred to as a resin in an uncured state) to be cured by receiving curing energy is used. As the curing energy, an electromagnetic wave or heat can be used. The electromagnetic wave can be, for example, light selected from the wavelength range of 10 nm (inclusive) to 1 mm (inclusive), for example, infrared rays, visible light, or ultraviolet light. The curable composition can be a composition cured by light irradiation or heating. Among these, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film formed by connecting a plurality of droplets. The viscosity (the viscosity at 25° C.) of the imprint material can be, for example, from 1 mPa·s (inclusive) to 100 mPa·s (inclusive).

In the specification and the accompanying drawings, directions will be indicated on an XYZ coordinate system in which directions parallel to the surface of the substrate 8 are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and a posture is information that can be specified by values on the θX-, θY-, and θZ-axes. Positioning means controlling the position and/or posture. Alignment can include controlling the position and/or posture of at least one of the substrate 8 and the mold 7.

[Configuration of Imprint Apparatus]

The configuration of the imprint apparatus 1 will exemplarily be described below. The imprint apparatus 1 can include a curing unit 2, a position detector 3, a mold driving mechanism 4, a substrate driving mechanism 5, a dispenser (imprint material supply unit) 6, and a controller 15. The controller 15 is formed by a computer including a processor such as a CPU and a memory, and controls the curing unit 2, the position detector 3, the mold driving mechanism 4, the substrate driving mechanism 5, and the dispenser 6, thereby controlling imprint processing. The controller 15 can be formed by, for example, a programmable logic device (PLD) such as a field programmable gate array (FPGA), an application specific integrated circuit (ASIC), a general-purpose computer incorporating a program, or a combination of some or all of these.

After a contact step of bringing the imprint material 9 on the substrate 8 into contact with the mold 7, the curing unit 2 irradiates the imprint material 9 with energy for curing the imprint material, thereby curing the imprint material 9. The curing unit 2 can include, for example, a light source that generates light for curing the imprint material 9. The light source can be, for example, a high pressure mercury lamp, various kinds of excimer lamps, an excimer laser, or a light-emitting diode. The mold 7 includes the pattern region 7a, as described above, and a pattern is formed by concave portions in the pattern region 7a. In a state in which the imprint material 9 on the substrate 8 and the pattern region 7a of the mold 7 are in contact, the concave portions in the pattern region 7a can be filled with the imprint material 9.

The substrate driving mechanism 5 can be configured to hold the substrate 8 and drive the substrate 8 for a plurality of axes (for example, three axes including the X-axis, the Y-axis, and the θZ-axis, and preferably, six axes including the X-axis, the Y-axis, the Z-axis, the θX-axis, the θY-axis, and the θZ-axis). The mold driving mechanism 4 can be configured to hold the mold 7 and drive the mold 7 for a plurality of axes (for example, three axes including the Z-axis, the θX-axis, and the θY-axis, and preferably, six axes including the X-axis, the Y-axis, the Z-axis, the θX-axis, the θY-axis, and the θZ-axis). The substrate driving mechanism 5 and the mold driving mechanism 4 form a driving mechanism that drives at least one of the substrate 8 and the mold 7 such that the relative position between the substrate 8 and the mold 7 is adjusted. Relative position adjustment by the driving mechanism includes driving for bringing the mold 7 into contact with the imprint material 9 on the substrate 8 and separating the mold 7 from the cured imprint material 9 (a pattern of a cured product).

To detect the relative position between the mold 7 and a shot region of the substrate 8, the position detector 3 (detection apparatus) detects, as position information, the relative position between a mark 11 (second mark) provided on the shot region and a mark 10 (first mark) provided on the mold 7. Here, the mark 11 and the mark 10 each form a position information detection target. The mark 11 and the mark 10 can each be, for example, a mark that forms a moiré fringe. In this case, based on the moiré fringe, the relative position between the mark 11 and the mark 10 can be detected by the position detector 3 as the position information of the detection target. Alternatively, the mark 11 and the mark 10 can form a box-in-box mark. In this case, the position of the mark 11 and the position of the mark 10 can be detected by the position detector 3 as the position information of the detection target.

The position detector 3 includes an optical system configured to observe a mark, and the optical axis of the optical system can be arranged to be perpendicular to the surface of the substrate 8. The position detector 3 can be driven by the driving mechanism configured to position the position detector 3 concerning the X and Y directions in accordance with the position of the mark of the detection target. Also, the position detector 3 may be driven concerning the Z direction for focus adjustment or may include an optical system for focus adjustment.

Based on the position information detected by the position detector 3, the controller 15 controls at least one of the substrate driving mechanism 5 and the mold driving mechanism 4 such that the mold 7 and the shot region of the substrate 8 are aligned. The imprint apparatus 1 may include a deformation mechanism that deforms the mold 7 to match the shape of the shot region of the substrate 8 with the shape of the pattern region 7a of the mold 7. In this case, based on the position information detected by the position detector 3, the controller 15 can detect the shape difference between the shot region and the pattern region 7a and control the deformation mechanism based on the shape difference.

The dispenser 6 arranges the imprint material 9 as a plurality of droplets on the shot region of the substrate 8. The dispenser 6 can be configured to, in a state in which the substrate 8 is driven by the substrate driving mechanism 5, discharge the imprint material 9 as a plurality of droplets at a timing according to a drop recipe. The drop recipe is information (map) showing the arrangement of the plurality of droplets of the imprint material 9 on the shot region. The dispenser 6 may be provided outside the imprint apparatus 1. In this case, the substrate 8 can be provided to the imprint apparatus 1 in a state in which the imprint material 9 is arranged on the substrate 8 by the dispenser 6.

[Imprint Processing]

Imprint processing by the imprint apparatus 1 will be described below. First, the substrate 8 is conveyed to the substrate holder (not shown) of the substrate driving mechanism 5 by a substrate conveyance mechanism (not shown) and held by the substrate holder. Next, under the control of the controller 15, the substrate 8 is driven by the substrate driving mechanism 5 such that a pattern formation target (imprint target) shot region (to be simply referred to as a "shot region" hereinafter) is arranged under the dispenser 6. While the substrate 8 is driven by the substrate driving mechanism 5, the imprint material 9 is arranged on the shot region by the dispenser 6.

Next, under the control of the controller 15, the substrate 8 is driven by the substrate driving mechanism 5 such that the shot region is arranged under the mold 7. Next, under the control of the controller 15, at least one of the mold driving mechanism 4 and the substrate driving mechanism 5 operates such that the imprint material 9 on the shot region and the pattern region 7a of the mold 7 come into contact.

Next, under the control of the controller 15, the position information (relative position) between the shot region of the substrate 8 and the pattern region 7a of the mold 7 is detected by the position detector 3, and alignment between the shot region and the pattern region 7a is performed based on the position information. The alignment between the shot region and the pattern region 7a can be done by at least one of the substrate driving mechanism 5 and the mold driving mechanism 4. At this time, the mold 7 may be deformed by a deformation mechanism based on the shape difference between the shot region and the pattern region 7a.

Next, under the control of the controller 15, the curing unit 2 irradiates, via the mold 7, the imprint material 9 with energy for curing, and the imprint material 9 is cured. Next, under the control of the controller 15, at least one of the mold driving mechanism 4 and the substrate driving mechanism 5 operates such that the cured product of the imprint material 9 on the shot region and the pattern region 7a of the mold 7 are separated. Thus, a pattern made of the cured product of the imprint material 9 is formed on the shot region.

[Example of Configuration of Detector]

Figure 2:
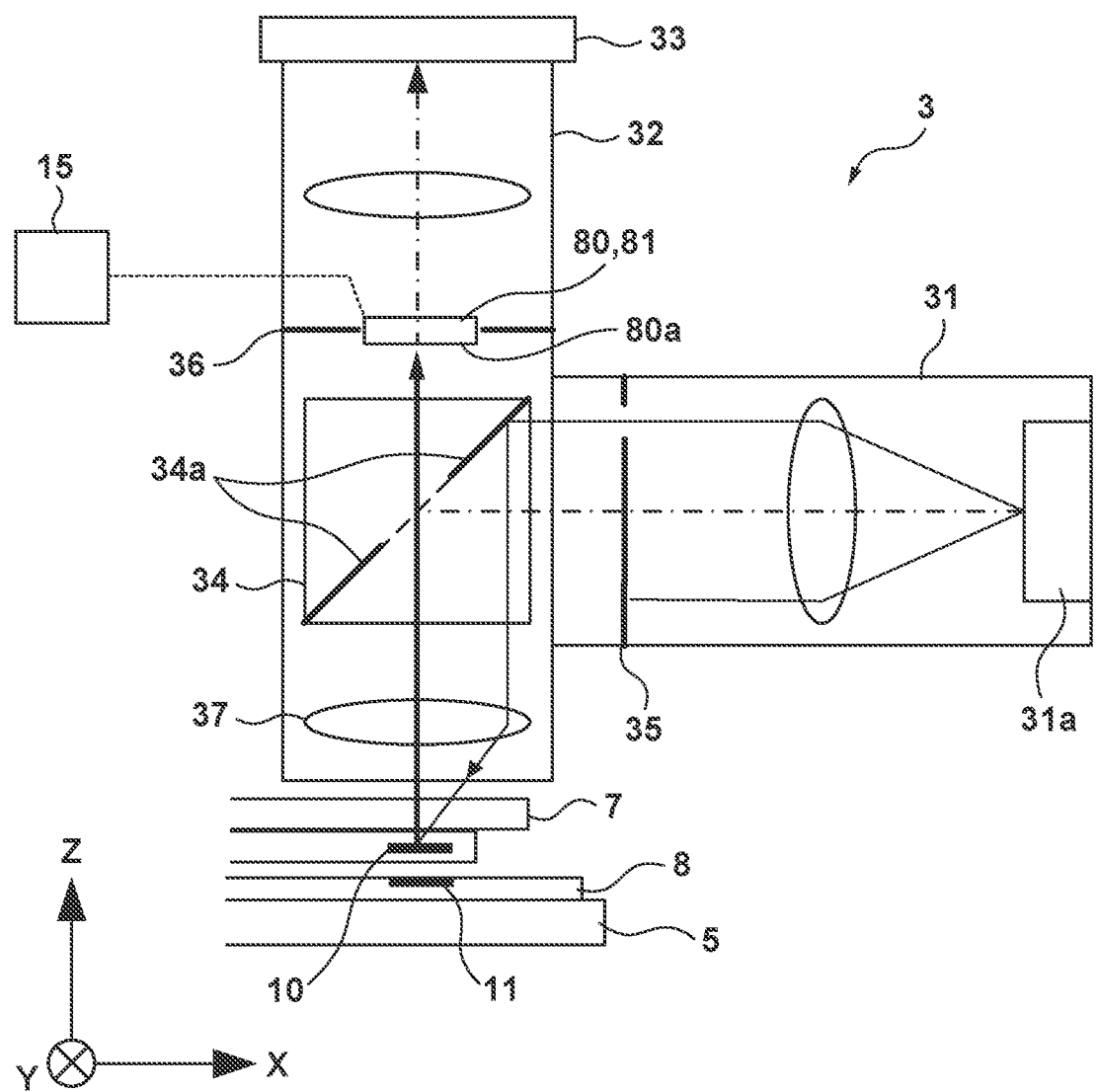
FIG. 2 is a view showing an example of the configuration of a position detector.

The configuration of the position detector 3 (detection apparatus) will exemplarily be described below. FIG. 2 shows an example of the configuration of the position detector 3. The position detector 3 can include an illumination optical system 31, a detection optical system 32, and a detector 33. In this embodiment, the illumination optical system 31 and the detection optical system 32 can be configured to share some components.

The illumination optical system 31 is an illuminator that includes a light source unit 31a configured to emit illumination light including a plurality of wavelengths (wavelength bands) and illuminates a detection target with illumination light from the light source unit 31a. The illumination optical system 31 according to this embodiment guides the illumination light from the light source unit 31a onto the same optical axis as the detection optical system 32 by an optical device such as a prism 34 and obliquely illuminates the mark 10 and the mark 11, which are the detection target. The light source unit 31a may be formed by one light source that emits illumination light including a plurality of wavelengths, or may be formed by a plurality of light sources that emit light components of wavelengths different from each other. As the light source included in the light source unit 31a, for example, at least one of a super continuum light source, a halogen lamp, an LED, a semiconductor laser (LD), a plasma light source, a high pressure mercury lamp, and a metal halide lamp can be used. As the illumination light, light having a wavelength that does not cure the imprint material 9 can be used. Also, the mark 10 and the mark 11, which are the detection target, can each be formed by a diffraction grating (that is, can include a diffraction grating pattern).

The detection optical system 32 guides, to the detector 33, at least some components of diffracted light on the detection target (the mark 10 and the mark 11) illuminated by the illumination optical system 31 (illuminator). The detector 33 receives the at least some components of the diffracted light guided by the detection optical system 32 and detects the position of the detection target. In this embodiment, the detector 33 can include an image capturing device such as a CCD or a CMOS image sensor. The detection optical system 32 forms, on the image capturing surface of the image capturing device (detector 33), a moiré fringe (interference fringe) generated by interference of diffracted light from the mark 10 and the mark 11, which are illuminated by the illumination optical system 31. Since the moiré fringe is formed by the diffracted light from the mark 10 of the mold 7 and the diffracted light from the mark 11 of the substrate 8, the light amount of the moiré fringe can depend on the diffraction efficiencies of the mold 7 and the substrate 8. In particular, since the diffraction efficiency changes depending on the wavelength, there exist a wavelength capable of efficiently detecting a moiré fringe and a wavelength difficult to detect a moiré fringe. Light of the wavelength difficult to detect a moiré fringe can be noise.

Figure 3:
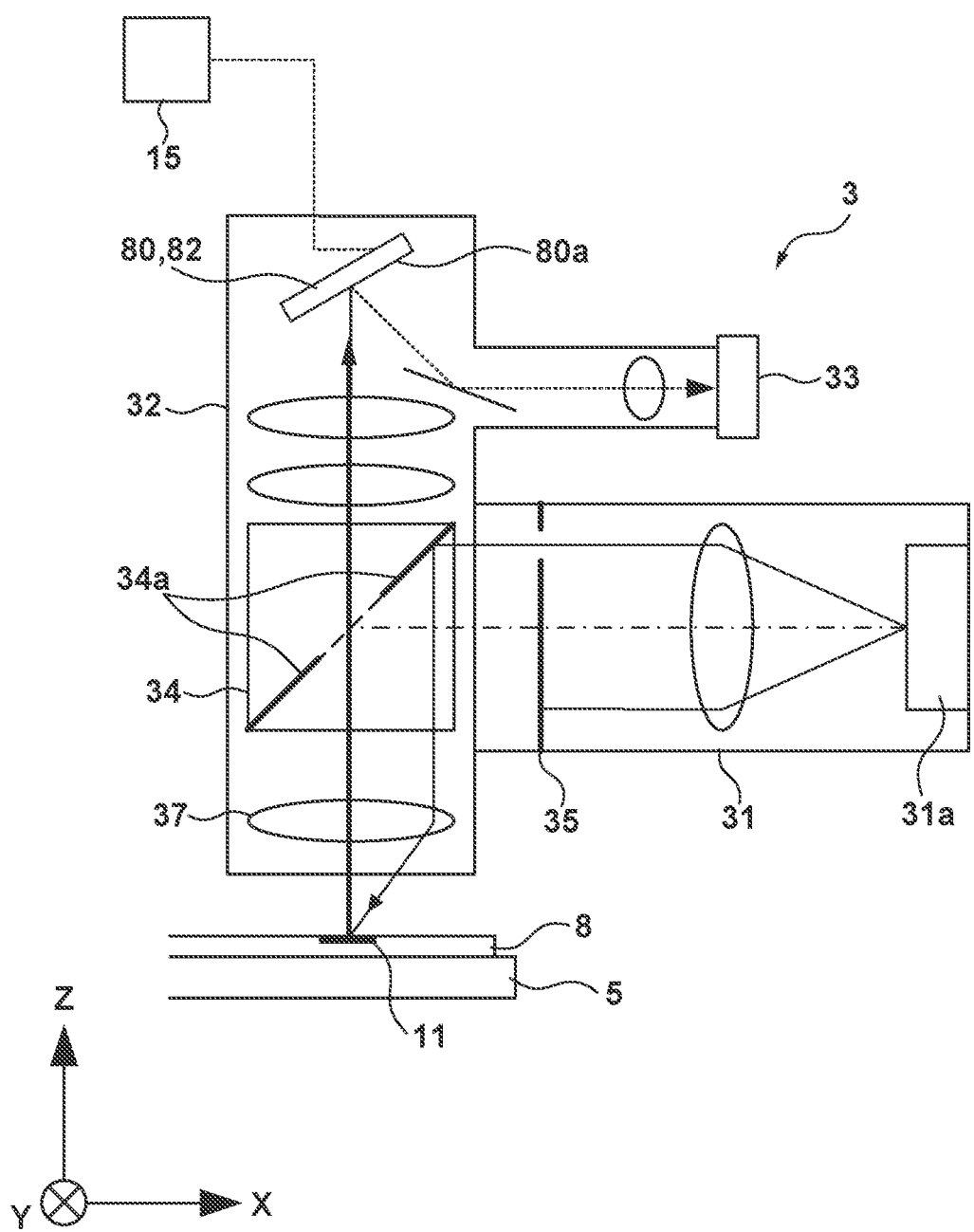
FIG. 3 is a view showing an example of the configuration of a position detector.

Here, the detector 33 may be understood to have a processing unit (processor) that obtains the position of the detection target (that is, the relative position between the mark 10 and the mark 11) based on the image of the moiré fringe captured by the image capturing device. The processing unit may be understood to form a part of the controller 15. Also, when separately measuring the position of the mold 7 and the position of the substrate 8, the position detector 3 may be configured to detect only the mark 11 of the substrate 8, as shown in FIG. 3, or may be configured to detect only the mark 10 of the mold 7. For example, if the position of the mark 11 of the substrate 8 is detected by the position detector 3, the position of the substrate 8 can be measured.

The prism 34 can be arranged on or near a pupil surface common to the illumination optical system 31 and the detection optical system 32. The prism 34 includes a bonding surface, and a reflection film 34a configured to reflect light in the peripheral portion of the pupil surface of the illumination optical system 31 can be provided on the bonding surface. The reflection film 34a also serves as an aperture stop that defines the size (or a detection NA: NAo) of the pupil of the detection optical system 32. The prism 34 may be a half prism with a semitransparent film on the bonding surface. A plate-shaped optical device with a reflection film formed on the surface may be used in place of the prism. Alternatively, a transparent portion may be formed on the peripheral portion of the prism 34 in FIG. 2, a reflection portion may be formed at the center portion, and the position of the light source unit 31a and the position of the detector 33 (image capturing device) may be interchanged.

The illumination optical system 31 and the detection optical system 32 include individual aperture stops 35 and 36 on the pupil surfaces. The position of the aperture stop 36 of the detection optical system 32 (detection side) has a conjugate relation with the position of the aperture stop 35 of the illumination optical system 31 (illumination side). Also, a wavelength selector 80 that selects light of a specific wavelength from diffracted light and guides it to the detector 33 (image capturing device) is provided at the position of the aperture stop 36 in the detection optical system 32. The wavelength selector 80 includes an incident surface 80a on which diffracted light from the detection target (the mark 10 and the mark 11) illuminated by the illumination optical system 31 is incident. On the incident surface 80a, a plurality of elements for switching light guide/nonguide of the diffracted light to the detector 33 are two-dimensionally arrayed. As described above, diffracted light from the detection target illuminated with illumination light including a plurality of wavelengths includes light of a wavelength capable of efficiently detecting a moiré fringe and light of a wavelength difficult to detect a moiré fringe (that is, light that can be noise). The wavelength selector 80 is configured to select light of a specific wavelength capable of efficiently detecting a moiré fringe from diffracted light and guide it to the detector 33. In this embodiment (the example shown in FIG. 2), an example in which an optical device formed by two-dimensionally arraying, on the incident surface 80a, a plurality of elements (pixels) for switching transmission/non-transmission of diffracted light is used as the wavelength selector 80 will be described. As the optical device, a liquid crystal filter 81 can be used.

Figure 4:
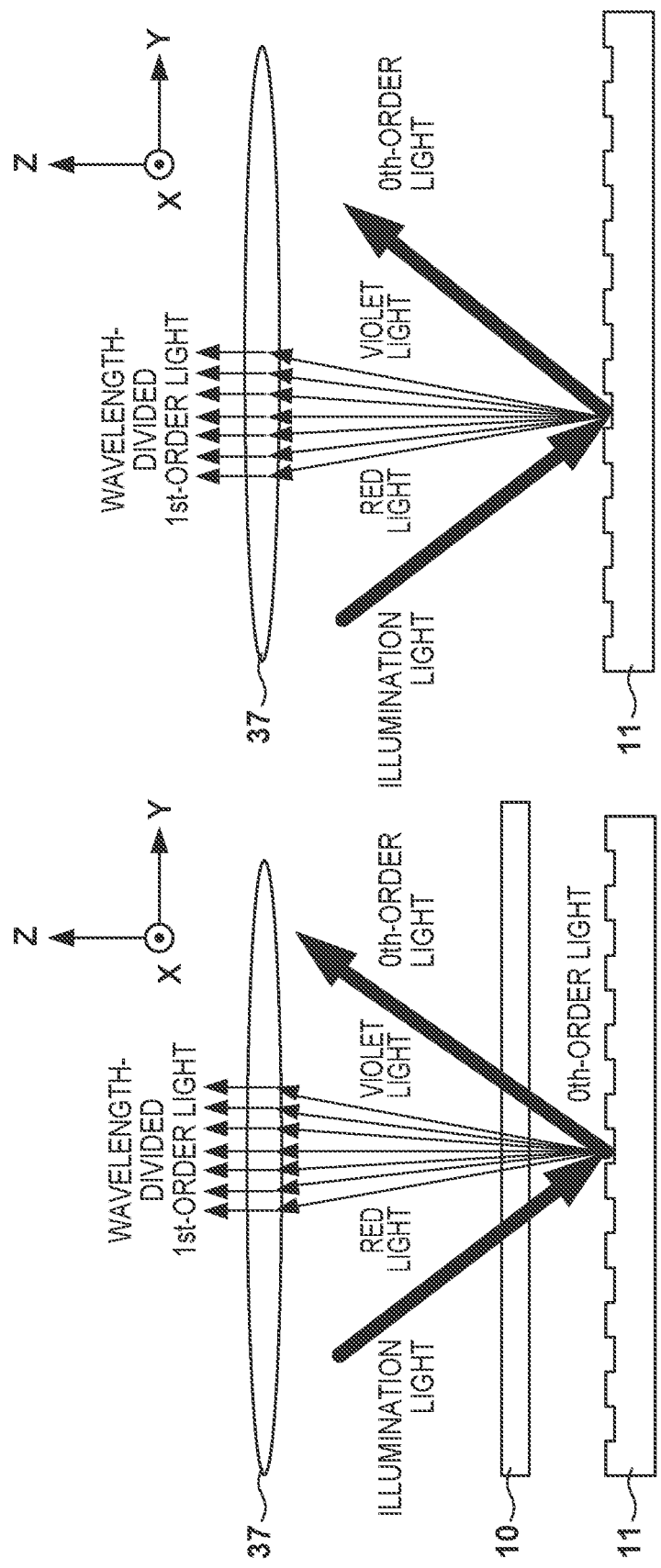
FIGS. 4A and 4B are views for explaining diffracted light.
Figure 5:
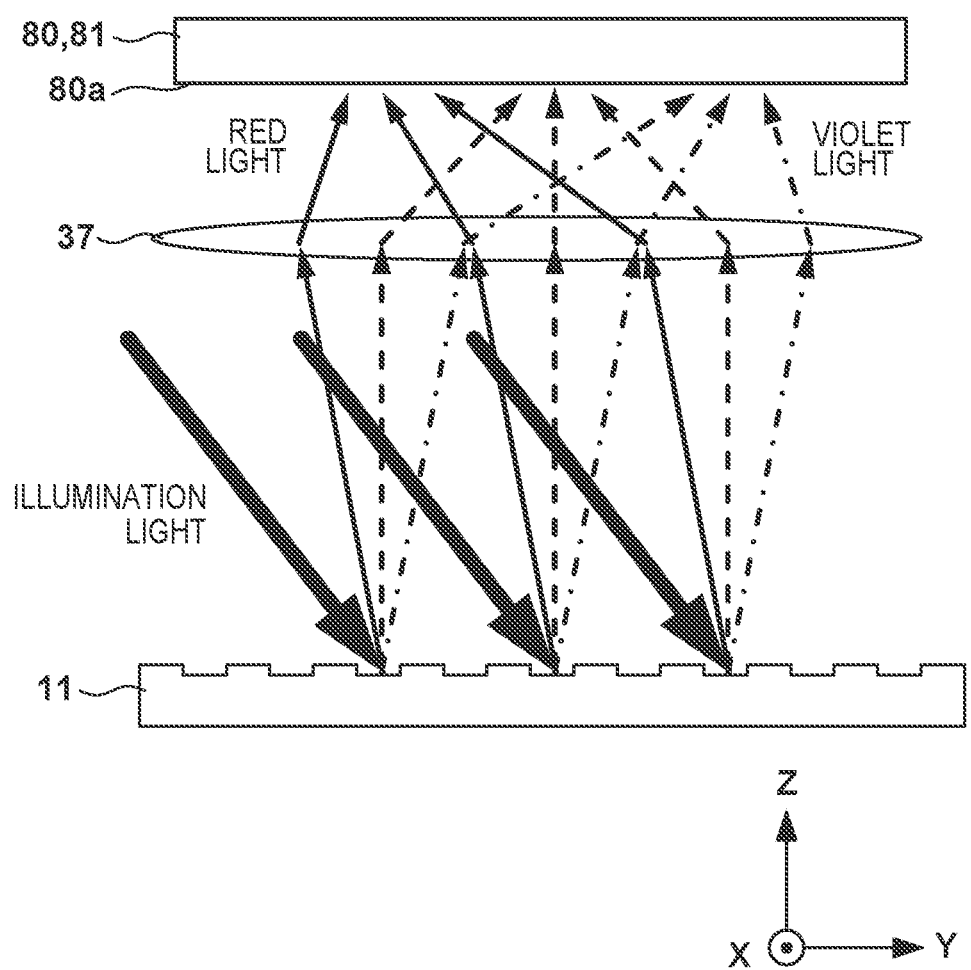
FIG. 5 is a view for explaining diffracted light.

FIGS. 4A, 4B, and 5 are views for explaining diffracted light generated when the mark 10 of the mold 7 and the mark 11 of the substrate 8 are illuminated. If the diffraction grating patterns of the mark 10 and the mark 11 are illuminated with illumination light including a plurality of wavelengths (wavelength bands), diffracted light is generated by the mark 10 and the mark 11. FIG. 4A shows light diffracted in the first order. Since the diffraction directions (diffraction angles) of light components of the plurality of wavelengths included in the illumination light are different from each other depending on the wavelength, the wavelengths can be divided. More specifically, the longer the wavelength is, the larger the angle of diffracted light is. As shown in FIG. 4A, red light is reflected (diffracted) at an angle larger than violet light with respect to 0th-order reflected light. Hence, if the detection target (the mark 10 and the mark 11) is obliquely illuminated with illumination light including a plurality of wavelengths, as shown in FIG. 5, the light components of the plurality of wavelengths included in the illumination light are incident as diffracted light, at positions different from each other, on the incident surface 80a of the wavelength selector 80. For this reason, the wavelength selector 80 controls each of the plurality of elements in accordance with the position where light of a specific wavelength is incident on the incident surface 80a, thereby selecting the light of the specific wavelength from the diffracted light and guiding it to the detector 33. A lens 37 is arranged on the optical path between the wavelength selector 80 and the detection target and can be configured to make the light components of the plurality of wavelengths diffracted by the detection target incident, at positions different from each other, on the incident surface 80a of the wavelength selector 80. Note that oblique illumination of the detection target means performing illumination so that illumination light is obliquely incident on the detection target. Light of a specific wavelength is, for example, light of a wavelength capable of efficiently detecting a moiré fringe, as described above.

The incident position of light of each wavelength on the incident surface 80a of the wavelength selector 80 is decided by the configuration of the position detector 3. Hence, information (to be sometimes referred to as first information hereinafter) representing the relationship between each of the plurality of wavelengths included in the illumination light and the incident position of light on the incident surface 80a can be acquired in advance by simulations or experiments. Thus, based on the first information, the wavelength selector 80 can control each of the plurality of elements to select light of a specific wavelength from the diffracted light and guide it to the detector 33.

Here, as shown in FIG. 4B, even if the detection target is only the mark 11 of the substrate 8, the wavelength of the 1st-order diffracted light from the mark 11 can be divided by selecting the pitch of the diffraction grating pattern of the mark 11. Also, even if the detection target is only the mark 10 of the mold 7, similarly, the wavelength of the 1st-order diffracted light from the mark 10 can be divided by selecting the pitch of the diffraction grating pattern of the mark 10. In this embodiment, 1st-order diffracted light has been described. This also applies to a case where diffracted light of the second, third, or larger order is used.

An example of a configuration for obliquely illuminating the detection target and detecting it will be described next with reference to FIG. 2. FIG. 2 shows an example in which the detection target (the mark 10 and the mark 11) is obliquely illuminated using the aperture stop 35. The mark 10 and the mark 11 in FIG. 2 are marks used to measure the relative position in the Y direction between the mold 7 and the substrate 8. When the mark 10 and the mark 11 are illuminated from a non-measurement direction (X direction), a moiré fringe in the Y direction can be detected. The 1st-order diffracted light of the illumination light wavelength-divided by the detection target is incident on the liquid crystal filter 81 (incident surface 80a) serving as the wavelength selector 80, as shown in FIG. 2.

Figure 6A:
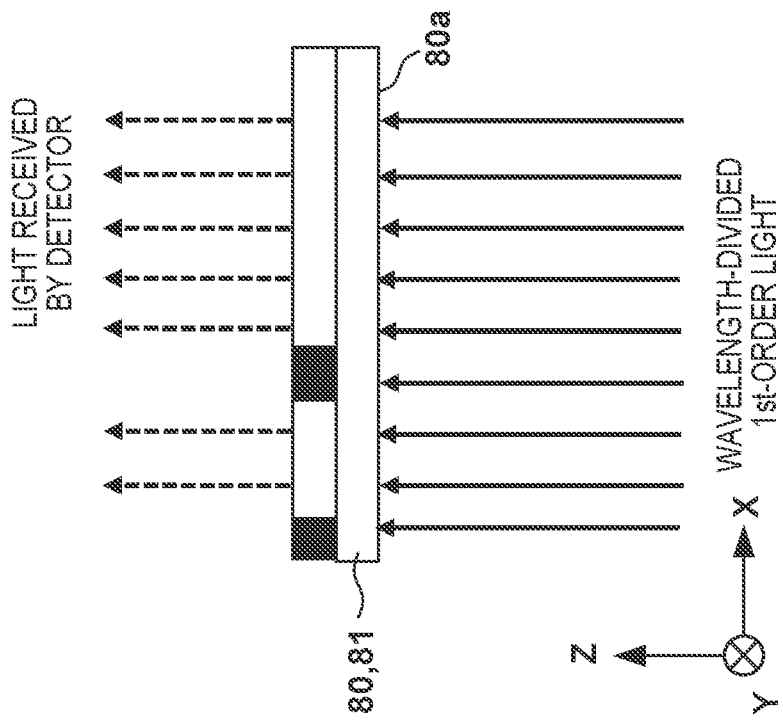
FIGS. 6A and 6B are views for explaining wavelength selection by a wavelength selector (liquid crystal filter)
Figure 6B:
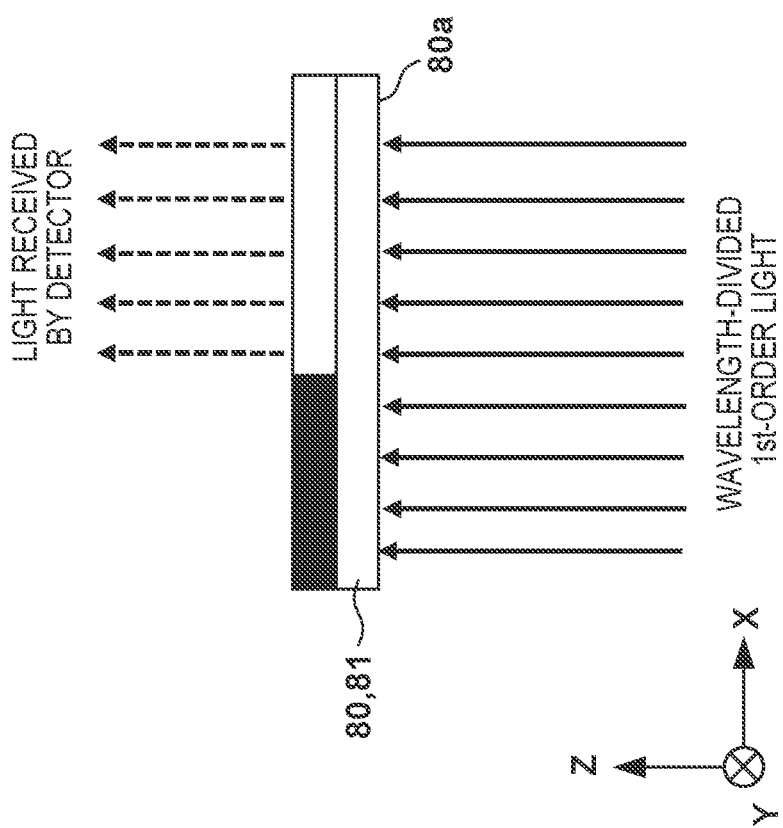

The liquid crystal filter 81 is formed by a plurality of elements (pixels), as described above, and it is possible to select, in each pixel, whether to transmit a light beam (diffracted light) or not. As the liquid crystal filter 81, a liquid crystal device including, for example, 640×480 pixels can be used. Under the control of the controller 15, the wavelength selector 80 (liquid crystal filter 81) selects, for each pixel, whether to transmit incident light and guide it to the detector 33. That is, as shown in FIGS. 6A and 6B, in accordance with the position where light of a specific wavelength is incident on the incident surface 80a, the wavelength selector 80 (liquid crystal filter 81) controls (switches) transmission/non-transmission of each pixel such that light of the specific wavelength is transmitted. Accordingly, the light of the specific wavelength can be selected from the 1st-order diffracted light and guided to the detector 33.

Figure 7:
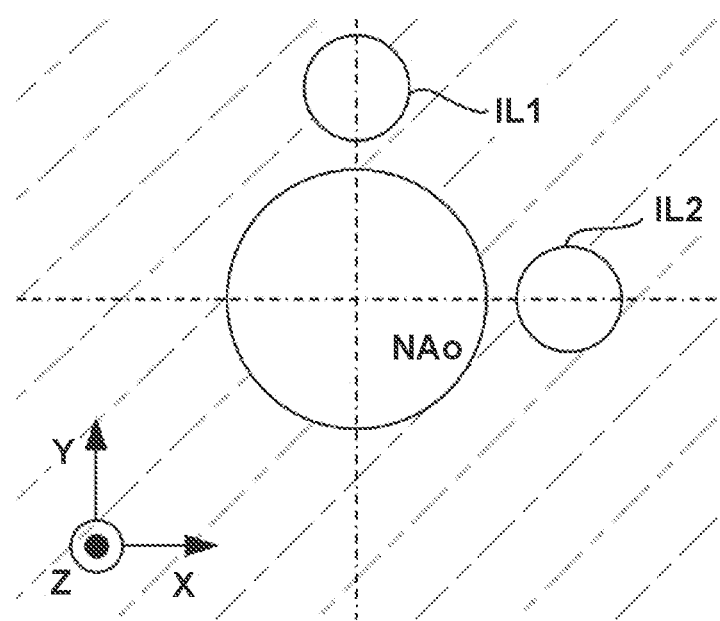
FIG. 7 is a view showing the relationship between the pupil intensity distribution of an illumination optical system and a numerical aperture NAo of a detection optical system.

FIG. 7 shows the relationship between the pupil intensity distribution (IL1 and IL2) of the illumination optical system 31 of the position detector 3 and the numerical aperture NAo of the detection optical system 32. The pupil intensity distribution of the illumination optical system 31 can include the first pole IL1 and the second pole IL2. If the relative position between the mold 7 and the substrate 8 is measured by a moiré fringe detection method, the first pole IL1 is illumination for an X mark, and the second pole IL2 is illumination for a Y mark. When measuring not a moiré fringe but only a diffraction grating pattern with a line-and-space pattern, diffracted light from the diffraction grating pattern with the line-and-space pattern is diffracted in the measurement direction. Hence, the first pole IL1 is illumination for a Y mark, and the second pole IL2 is illumination for an X mark.

In the first pole IL1 and the second pole IL2 shown in FIG. 7 are arranged on the positive side of the Y direction and on the positive side of the X direction, respectively. However, both may be arranged on the negative side. A case where only the first pole IL1 or the second pole IL2 is used can also be considered. The aperture stop 35 is made by forming a Cr film on a metal plate or glass and arranged on the pupil surface of the illumination optical system 31. This can form a plurality of poles (that is, the first pole IL1 and the second pole IL2) by light beams from the light source unit 31a and generate a light beam (light flux) for obliquely illuminating the detection target. That is, of the light beams from the light source unit 31a, light beams that are not used for measurement (that is, light beams that can be noise) can be blocked. In addition, when the number of openings of the aperture stop 35 is changed, a monopole, a dipole, or a quadrupole can be formed. In this embodiment, to avoid interference of light wavelength-divided by the mark 10 and the mark 11, for example, as shown in FIG. 7, a single pole is preferably formed in each of the X and Y directions, like the first pole IL1 and the second pole IL2. The light beam from the illumination optical system 31 is passed through the aperture stop 35 and reflected by the reflection film 34a of the prism 34, thereby obliquely illuminating the marks 10 and 11.

[Detection of Moiré Fringe]

The generation principle of a moiré fringe by diffracted light from the mark 10 and the mark 11 and detection of the relative position between the mark 10 (mold 7) and the mark 11 (the shot region on the substrate 8) using a moiré fringe will be described below with reference to FIGS. 8A and 8B. A diffraction grating 41 shown in FIG. 8A can be provided as the mark 10 on the mold 7, and a diffraction grating 42 shown in FIG. 8B can be provided as the mark 11 on the substrate 8. The diffraction grating 41 and the diffraction grating 42 are marks used to detect the relative position between the mark 10 (mold 7) and the mark 11 (substrate 8) in the X direction, and the periods of patterns (gratings) in the X direction that is the detection direction are slightly different. When the two diffraction gratings 41 and 42 whose grating periods are different from each other are overlaid, a moiré fringe that is a pattern with a period reflecting the period difference between the diffraction gratings appears due to the interference of diffracted light from the two diffraction gratings. Since the phase of the moiré fringe changes depending on the relative position between the diffraction gratings, the relative position between the mark 10 and the mark 11, that is, the relative position between the mold 7 and (the shot region on) the substrate 8 can be obtained by detecting the moiré fringe.

More specifically, when the diffraction grating 41 and the diffraction grating 42, which have slightly different periods, are overlaid, diffracted light components from the diffraction gratings 41 and 42 overlap, and a moiré fringe having a period reflecting the period difference is generated, as shown in FIG. 8C. The bright/dark position (phase) of the moiré fringe changes depending on the relative position between the diffraction grating 41 and the diffraction grating 42. For example, if one of the diffraction gratings 41 and 42 is shifted in the X direction, the moiré fringe shown in FIG. 8C can change as shown in FIG. 8D. The moiré fringe is generated as a fringe with a large period that increases the position deviation amount between the diffraction grating 41 and the diffraction grating 42. For this reason, even if the resolution of the detection optical system 32 (detector 33) is low, the relative position between the diffraction grating 41 and the diffraction grating 42 can accurately be detected. Here, to accurately detect the moiré fringe, the system preferably has a dark field configuration in which the diffraction gratings 41 and 42 are illuminated by oblique incidence (that is, obliquely illuminated), diffracted light diffracted in the vertical direction by the diffraction gratings 41 and 42 is detected by the detector 33, and 0th-order light is not detected.

The light diffracted in the X direction by the diffraction gratings whose periods are slightly different is incident on the detection region (NAo) on the pupil of the detection optical system 32 while holding the relative position information in the X direction and is detected by the detector 33 (image capturing device). Using this, the relative position between the two diffraction gratings can be obtained. Also, the detector 33 (image capturing device) can form an image from the received light and obtain the relative position between the origin position of the image and the deviation of the mark.

Figure 9D:
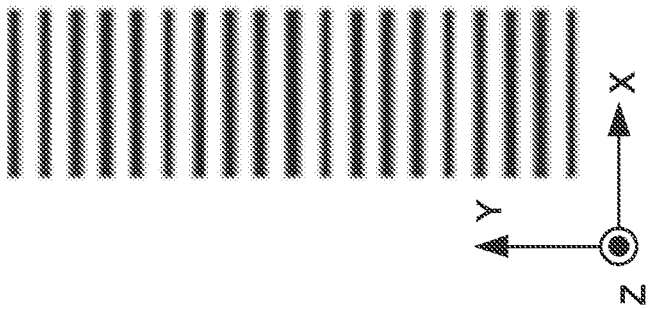
FIGS. 9A to 9D are views showing examples of the configuration of a diffraction grating serving as a mark.
Figure 9C:
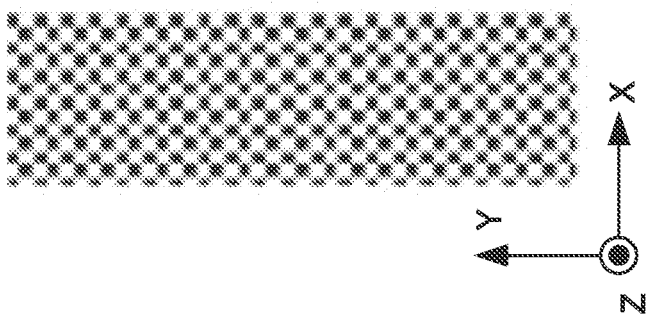
Figure 9A:
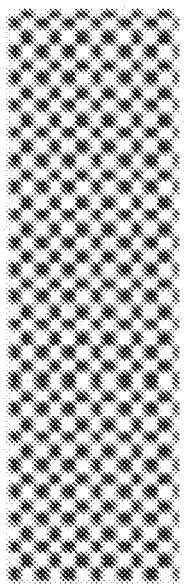
Figure 9B:
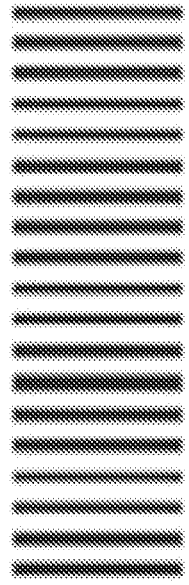

In addition, one of the diffraction gratings 41 and 42 may be a diffraction grating with a checkerboard pattern as shown in FIG. 9A, and the other diffraction grating may be a diffraction grating as shown in FIG. 9B. The diffraction grating shown in FIG. 9A includes a pattern periodically arrayed in the detection direction and a pattern periodically arrayed in a direction orthogonal to the detection direction. In the configuration shown in FIGS. 9A and 9B, light from the first pole IL1 is incident on the diffraction gratings, and is diffracted in the Y direction and simultaneously diffracted in the X direction by the diffraction grating with a checkerboard pattern. Note that FIGS. 9A and 9B show marks (diffraction gratings) whose detection direction is the X direction. Marks (diffraction gratings) whose detection direction is the Y direction can similarly be configured. FIGS. 9C and 9D show marks (diffraction gratings) whose detection direction is the Y direction. The diffraction grating with a checkerboard pattern shown in FIG. 9A or 9C is provided on one of the mold 7 and the substrate 8, and the diffraction grating with a line-and-space pattern shown in FIG. 9B or 9D is provided on the other of the mold 7 and the substrate 8.

Here, light from the second pole IL2 in the pupil intensity distribution shown in FIG. 7 is not used to detect the relative position between the diffraction gratings shown in FIGS. 9A and 9B. However, when detecting the relative position between the diffraction gratings shown in FIGS. 9C and 9D, light from the second pole IL2 is used to detect the relative position between the diffraction gratings, and light from the first pole IL1 is not used to detect the relative position between the diffraction gratings. Also, when arranging the set of diffraction gratings shown in FIGS. 9A and 9B and the set of diffraction gratings shown in FIGS. 9C and 9D in the same visual field of the detection optical system 32 (detector 33) and detecting the relative positions in the two directions simultaneously, the pupil intensity distribution shown in FIG. 7 is advantageous.

The principle of detecting a moiré fringe by the detector 33 in a state in which the two marks, that is, the mark 10 (the diffraction grating with a checkerboard pattern) and the mark 11 (the diffraction grating with a line-and-space pattern) are overlaid will be described next with reference to FIGS. 10A and 10B and FIGS. 11A and 11B.

FIG. 10A shows the pitch of a mark with a checkerboard pattern, and FIG. 10B shows the pitch of a diffraction grating with a line-and-space pattern. The mark with a checkerboard pattern shown in FIG. 10A has a pitch Pmm in the X direction and a pitch Pmn in the Y direction. The mark with a line-and-space pattern shown in FIG. 10B has a pitch Pw in the X direction. Note that the periods of the mark 10 in the X direction and the Y direction may be equal, or the periods of the mark 10 in the X direction and the Y direction may be different.

Figure 11B:
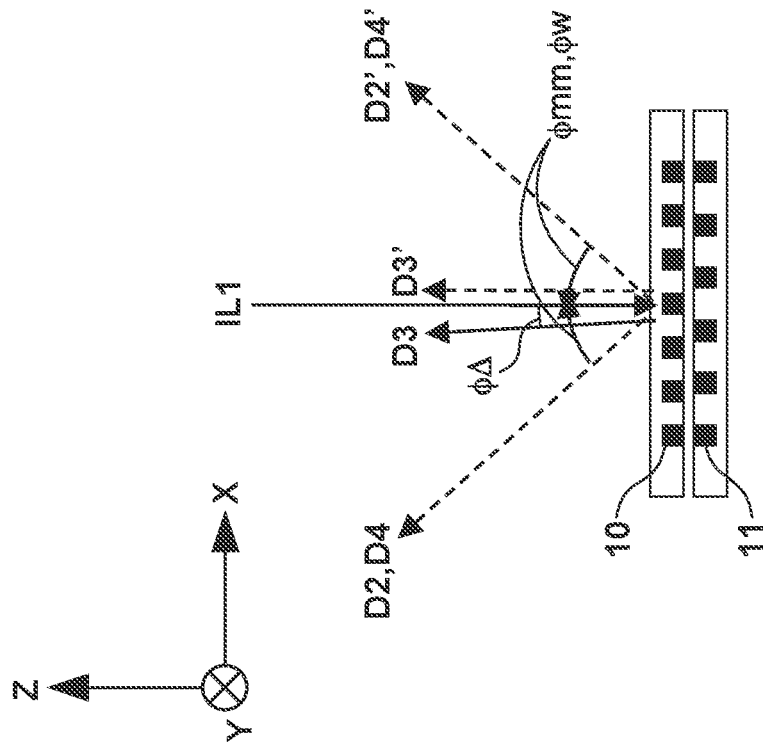
FIGS. 11A and 11B are views for explaining the detection principle of a moiré fringe.
Figure 11A:
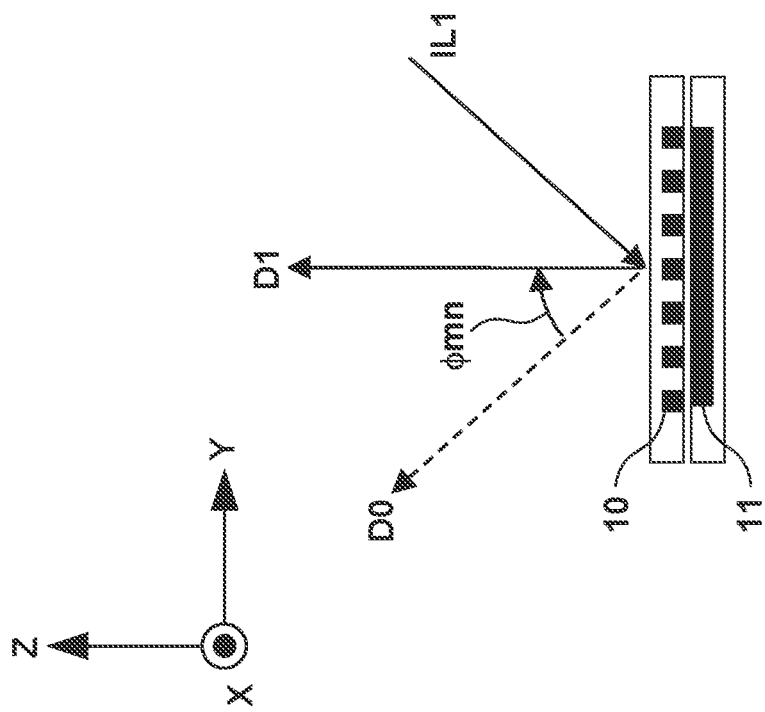

FIG. 11A is a view showing the mark 10 and the mark 11 whose detection direction is the X direction, which are viewed from the X direction, and FIG. 11B is a view showing the mark 10 and the mark 11, which are viewed from the Y direction. A moiré fringe used to detect the relative position concerning the X direction is generated by light from the first pole IL1 arranged on the Y-axis on the illumination pupil surface shown in FIG. 7. Here, letting λ be the wavelength of light, and n be the diffraction order, diffraction angles φmn, φmm, and φw by the diffraction gratings are represented by $$\sin \phi mn = n\lambda/Pmn \qquad (1)$$

Hence, letting φm and φw be the diffraction angles by the mark 10 and the mark 11, respectively, equations (2) and (3) are obtained.

$$\sin \phi mm = n\lambda/Pm \qquad (2)$$

$$\sin \phi w = n\lambda/Pw \qquad (3)$$

FIGS. 11A and 11B show a case where n=1. FIG. 11A is a view representing the Y-Z plane. FIG. 11A shows incident light (to be sometimes referred to as incident light IL1 hereinafter) from the first pole IL1, specular reflected light D0 of the incident light IL1, and diffracted light D1 from the mark 10 including the diffraction grating with a checkerboard pattern. The diffracted light D1 is not a light beam reflected (diffracted) by the mark 10 of the mold 7 but a light beam reflected (diffracted) by the mark 11 of the substrate 8. The diffracted light D1 is detected by the detector 33.

Here, as indicated by equation (1), the exit angle of diffracted light changes in accordance with the wavelength. The light divided for each wavelength is Fourier-transformed using the lens 37 or the like, and is incident on the Fourier transform surface at a position that is different for each wavelength. That is, the information of the exit angle of diffracted light can be converted into position information on the Fourier transform surface. In this embodiment, the wavelength selector 80 (liquid crystal filter 81) is arranged on the Fourier transform surface. Thus, as described above with reference to FIG. 5, it is possible to make the light components of a plurality of wavelengths included in the diffracted light incident, at positions different from each other, on the incident surface 80a of the wavelength selector 80 and select only light of a specific wavelength from the diffracted light by the wavelength selector 80.

FIG. 11B is a view representing the X-Z plane and shows the light beams of 1st-order diffracted light of the incident light IL1. Diffracted light components D2 and D2' represent ±1st-order light components diffracted by the mark 10, respectively, and diffracted light components D4 and D4' represent ±1st-order light components diffracted only by the mark 11, respectively. Diffracted light components D3 and D3' represent light diffracted once by the mark 10 and light diffracted once by the mark 11, respectively, and correspond to the diffracted light D1 in FIG. 11A. The pitches of the mark 10 and the mark 11 in the X direction (detection direction) are slightly different. For this reason, as indicated by 4A in FIG. 11, the angle on the X-Y plane is slightly different between the diffracted light D3 generated by the +1st-order light on the mark 10 and the −1st-order light on the mark 11 and the diffracted light D3' generated by the −1st-order light on the mark 10 and the +1st-order light on the mark 11. Because of the slight angle difference ($\phi\Delta$), a beat signal (moiré fringe) is generated. For example, if the pitches of the diffraction grating patterns are represented by Pmn=4 µm, Pm=1 µm, and Pw=1.04 µm, the period of the moiré fringe is given by PmxPw/(Pw−Pm)/2=13 µm. Note that the pitches of the diffraction grating patterns are not limited to the above-described values, and can be determined in consideration of the size of each mark.

[Detection Error in Detector]

Figure 12A:
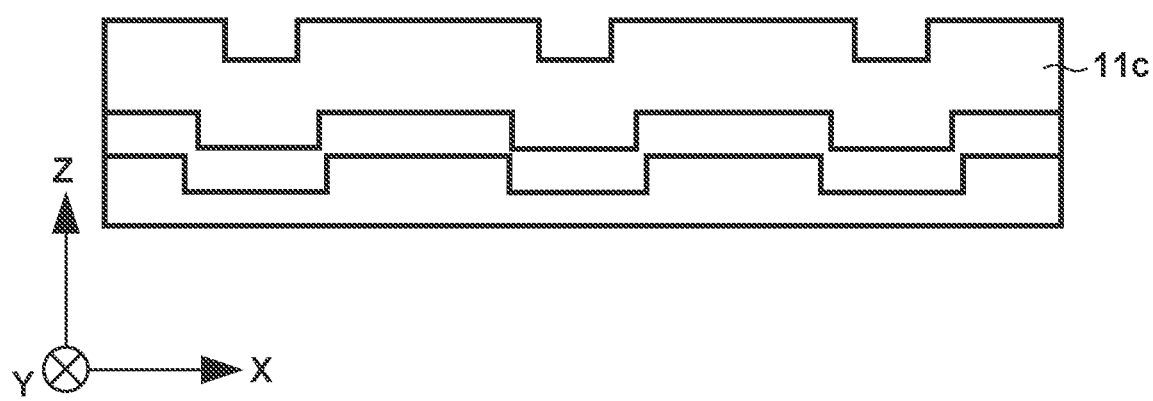
FIGS. 12A and 12B are views for explaining the sectional structure of a mark (detection target)
Figure 12B:
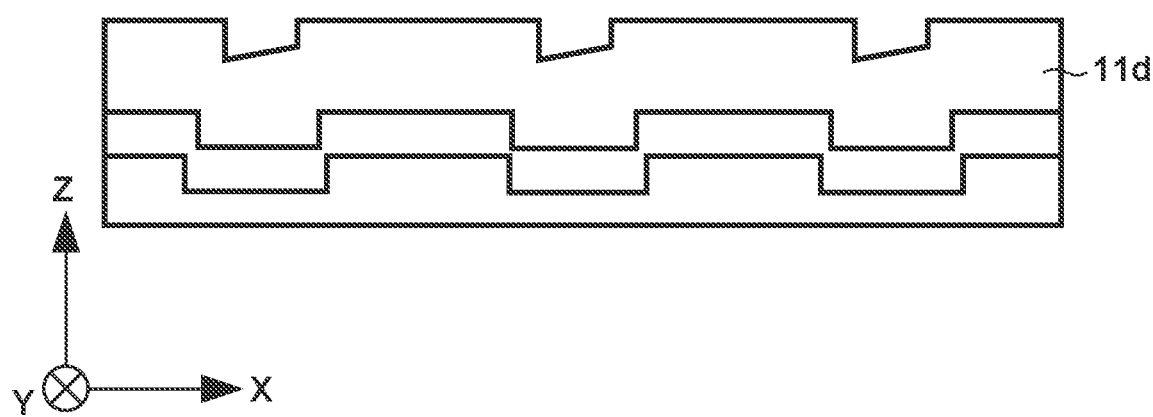

A detection error in the position detector 3 (detector 33) will be described next. FIGS. 12A and 12B are views for exemplarily explaining the sectional structure of a mark (detection target). In the example shown in FIGS. 12A and 12B, a mark has a structure formed by three layers. Since these layers have step differences, diffraction of light is caused by the step differences at the time of light irradiation. Hence, the structure can be recognized as a mark. A mark 11c shown in FIG. 12A is a mark having no shape error (manufacturing error). A mark 11d shown in FIG. 12B is a mark having an asymmetrical shape error (manufacturing error). Since the mark 11c has a symmetrical structure, diffracted light has an ideal diffraction angle. For this reason, no error occurs in the position of the detected mark. On the other hand, since the mark 11d has an asymmetrical shape error, the diffraction angle of diffracted light deviates from an ideal state by an amount corresponding to the asymmetricity. Hence, the position of the detected mark can have an error relative to the actual position. That is, in the position detector 3 (detector 33), the detection error of the position of the mark may occur. If the error is large, the overlay accuracy between the layers of the substrate may lower to cause a manufacturing failure.

Figure 13A:
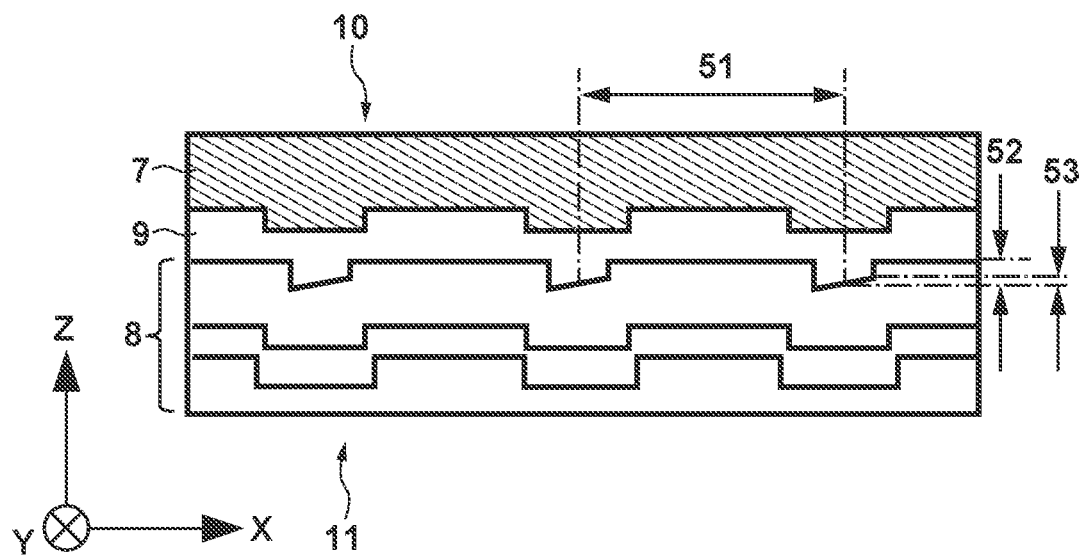
FIGS. 13A and 13B are views for explaining the relationship between the wavelength of illumination light and a detection error.
Figure 13B:
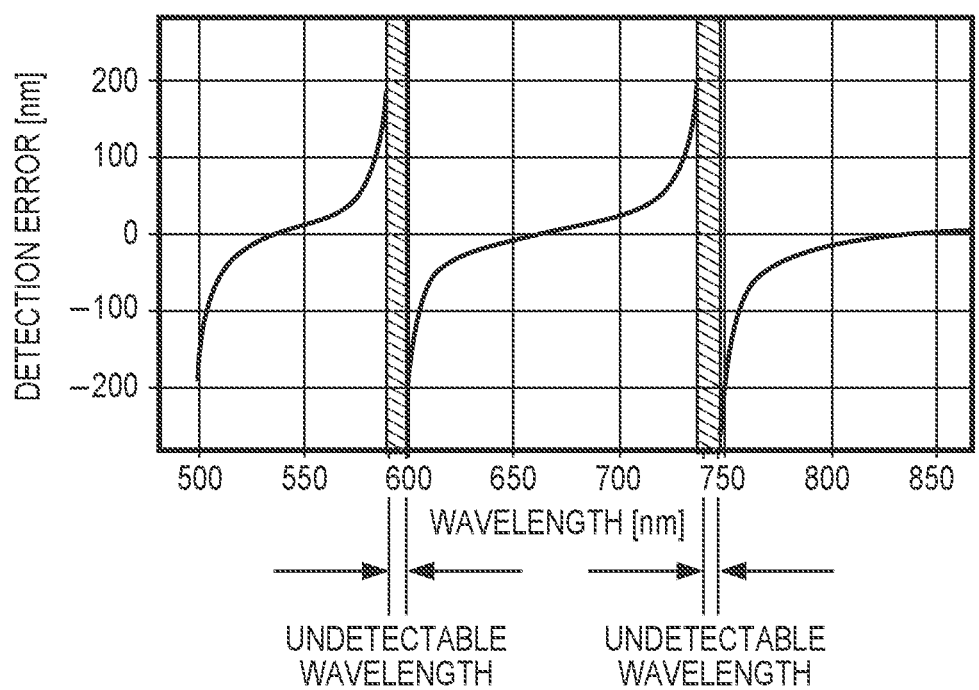

The relationship between the wavelength of illumination light of the position detector 3 and the detection error of the position detector 3 will be exemplarily described with reference to FIGS. 13A and 13B. Here, the detection error of the position detector 3 is a detection error that occurs because the mark 11 has an asymmetrical shape (manufacturing error). FIG. 13A shows the sectional shapes of the mark 11 of the substrate 8 and the mark 10 of the mold 7 when the mold 7 (pattern region 7a) and the substrate 8 (shot region) are brought into contact via the imprint material 9. FIG. 13B shows the result of performing a simulation for the sectional shapes shown in FIG. 13A (a wavelength characteristic (second information) representing the relationship between each of the plurality of wavelengths included in the illumination light of the position detector 3 and the detection error of the position detector 3).

In the simulation, the mark 11 is formed by a diffraction grating pattern with a checkerboard pattern, a step difference 52 of the diffraction grating pattern is 200 nm, a pitch 51 is 1,000 nm, and an error amount 53 of the shape is 40 nm. The base material of the substrate 8 is formed by a silicon substrate, and the mark 11 is made of $SiO_2$. The mold 7 is arranged on the mark 11 while interposing the imprint material 9.

FIG. 13B shows the simulation result (wavelength characteristic). The abscissa of FIG. 13B represents the wavelength of light used to detect the mark, and the ordinate represents the detection error. The detection error plotted along the ordinate is the detection error of the position detector 3 (the detection error of the relative position between the mark 10 and the mark 11) caused by the asymmetrical shape of the mark 11. As shown in FIG. 13B, the detection error of the position detector 3 changes in accordance with the wavelength of light, and the mark cannot be detected in the wavelength range of 590 to 600 nm. For this reason, this wavelength band should not be used. Also, a wavelength of 540 nm and a wavelength of 650 nm are wavelengths at which the detection error becomes small, and the mark can stably be detected near the wavelength, even if the mark shape includes a small error. That is, the detection error of the position detector 3 can be reduced. It is therefore preferable to detect the mark by positively utilizing light of this wavelength (near 540 nm or 650 nm) as the above-described light of the specific wavelength.

[Specific Wavelength Decision Method]

Figure 14:
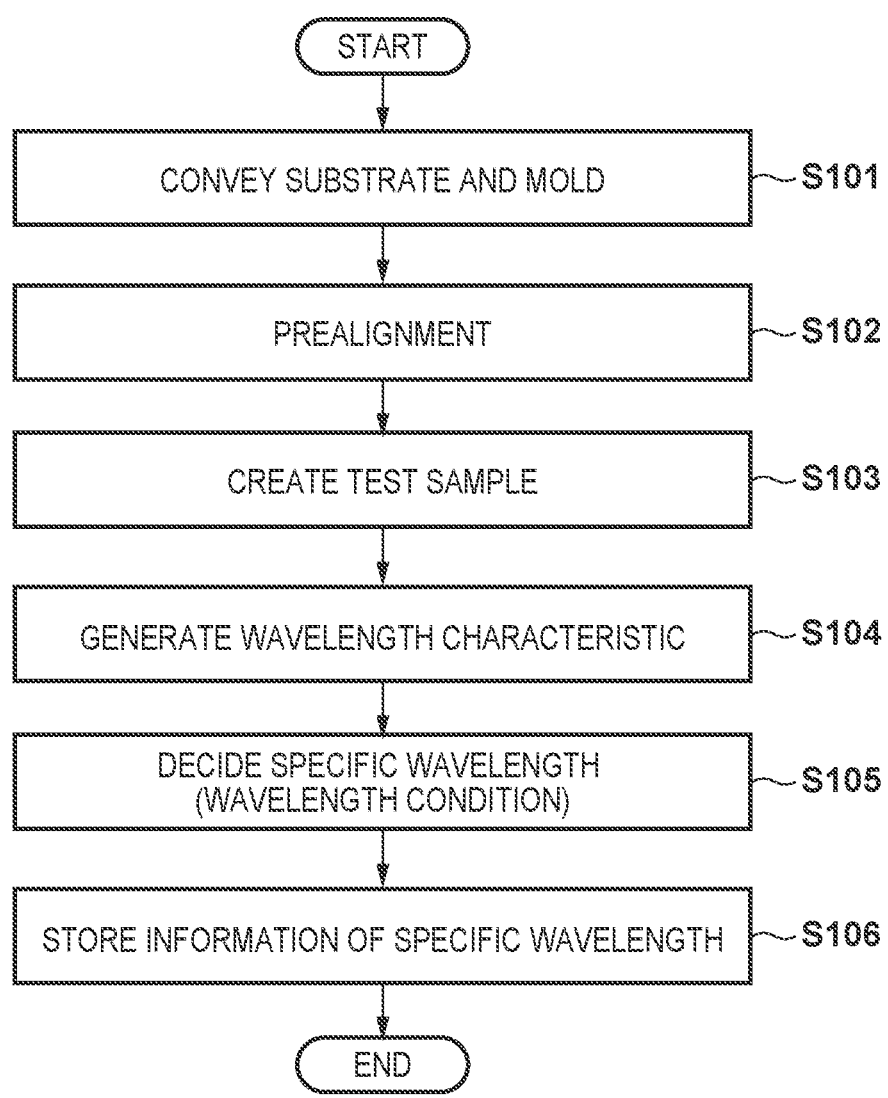
FIG. 14 is a flowchart showing a specific wavelength decision method.

A method of deciding the specific wavelength to be selected by the wavelength selector 80 (liquid crystal filter 81) of the position detector 3 will exemplarily be described below with reference to FIG. 14. FIG. 14 is a flowchart showing the specific wavelength decision method. Each step in the flowchart of FIG. 14 can be controlled by the controller 15. In FIG. 14, steps S101 to S103 are steps of forming a test sample. Step S104 is a step of detecting the relative position between the mark 10 and the mark 11 by the position detector 3 while changing the wavelength to be detected using the test sample, thereby obtaining a wavelength characteristic concerning the test sample. The wavelength characteristic is information (second information) representing the relationship between each of the plurality of wavelengths included in illumination light and the detection error of the position detector 3 (detector 33). Step S105 is a step of deciding, based on the wavelength characteristic obtained in step S104, a specific wavelength to be selected by the wavelength selector 80 and guided to the detector 33. Step S106 is a step of storing the information of the specific wavelength decided in step S105. Steps S101 to S106 will be described below in detail.

In step S101, the substrate 8 having the same structure as a substrate for article manufacturing is conveyed to the substrate holder of the substrate driving mechanism 5 and held by the substrate holder. Also, in step S101, the mold 7 for article manufacturing is conveyed to the mold holder of the mold driving mechanism 4 and held by the mold holder. In step S102, a shot region as the test sample formation target on the substrate 8 and the pattern region 7a of the mold 7 are prealigned. The prealignment can be done by, for example, in a state in which the substrate 8 and the mold 7 are apart, detecting, by the position detector 3, the relative position between the mark 11 in one or more shot regions of the substrate 8 and the mark 10 of the mold 7.

In step S103, the imprint material 9 is arranged, by the dispenser 6, on the shot region as the test sample formation target on the substrate 8. In step S103, next, at least one of the mold driving mechanism 4 and the substrate driving mechanism 5 is driven such that the imprint material 9 and the pattern region 7a of the mold 7 come into contact with each other. In step S103, next, the shot region and the pattern region 7a of the mold 7 are aligned while detecting, by the position detector 3, the relative position between the mark 11 on the shot region as the test sample formation target and the mark 10 of the mold 7. Here, the detection result by the position detector 3 may include a detection error caused by the asymmetrical shape of the mark 11 of the substrate 8. In step S103, next, the imprint material 9 is cured by the curing unit 2. Thus, a structure having a pattern made of the cured product of the imprint material 9 is formed as a test sample on the shot region.

The wavelength used for the prealignment in step S102 may be the same as the wavelength used for the alignment at the time of imprint in step S103 or may be different. Since an air layer is formed between the substrate 8 and the mold 7 at the time of prealignment, the optimum wavelength for detection may be different from that in imprint. In this case, alignment can accurately be performed by changing the wavelength condition between prealignment and imprint.

In step S104, in a state in which the pattern made of the cured product of the imprint material 9 and the pattern region 7a of the mold 7 are in contact, the wavelength characteristic of the test sample formed in step S103 is acquired using the position detector 3. More specifically, the wavelength selector 80 (controller 15) performs wavelength selection by controlling each of the plurality of elements arrayed on the incident surface 80a such that each of the light components of the plurality of wavelengths (wavelength bands) included in the illumination light from the light source unit 31a is received (detected) as test light by the detector 33. Then, the detector 33 is caused to detect the position of the test sample for each of the light components of the plurality of wavelengths. For example, of the plurality of wavelengths included in the illumination light, light of a first wavelength is selected by the wavelength selector 80 and guided to the detector 33, and the detector 33 is caused to detect the position of the test sample. Next, of the plurality of wavelengths included in the illumination light, light of a second wavelength different from the first wavelength is selected by the wavelength selector 80 and guided to the detector 33, and the detector 33 is caused to detect the position of the test sample. In this way, while changing the wavelength of light to be selected by the wavelength selector 80 and guided to the detector 33, the detector 33 is caused to detect the position of the test sample for each wavelength. A wavelength characteristic as shown in FIG. 13B can thus be obtained. Such a wavelength characteristic is preferably acquired for each of a plurality of positions on the substrate (for example, each of a plurality of shot regions on the substrate). In this case, the wavelength selector preferably changes the specific wavelength between the plurality of shot regions (between the plurality of regions) based on the wavelength characteristic acquired for each of the plurality of shot regions. Note that in this embodiment, the test sample is formed in steps S101 to S103, and the wavelength characteristic is obtained using the test sample in step S104. The wavelength characteristic as shown in FIG. 13B can also be obtained by a simulation as described above.

In step S105, based on the wavelength characteristic obtained in step S104, a specific wavelength (wavelength selection condition) to be selected by the wavelength selector 80 of the position detector 3 when manufacturing an article using the mold 7 is decided. The specific wavelength is the wavelength of light that the detector 33 should receive to efficiently detect a moiré fringe, as described above. The specific wavelength may be understood as a wavelength capable of reducing the detection error of the detector 33 caused by the asymmetrical shape of the mark 11 due to a manufacturing error. The specific wavelength is not limited to one wavelength and may be a wavelength band having a bandwidth to some extent. The wavelength band selected as the specific wavelength may be one continuous wavelength band or may include a plurality of wavelength bands apart from each other.

In step S106, the information of the specific wavelength decided in step S105 is stored. As the storage destination of the information of the specific wavelength, the storage unit (memory) of the controller 15 can be used. However, a device provided outside the imprint apparatus 1 may be used. Hence, when manufacturing an article using the mold 7, the wavelength selector 80 (controller 15) can select, based on the information, light of the specific wavelength from diffracted light on the detection target (the mark 10 and the mark 11) and guide it to the detector 33. That is, it is possible to accurately detect the relative position (position information) between the mark 10 and the mark 11 while reducing the detection error of the detector 33 caused by the asymmetrical shape of the mark 11 due to a manufacturing error.

An additional explanation will be made concerning step S104. Selection of the wavelength of light to be detected by the detector 33 as test light can be done by controlling light guide/nonguide in each of the plurality of elements (pixels) of the wavelength selector 80 based on the above-described first information. When generating the wavelength characteristic (second information), the wavelength of test light to be selected by the wavelength selector 80 and received by the detector 33 is preferably changed sequentially from the short wavelength or long wavelength side. Also, to stably measure light independently of the manufacturing variation of a wafer, a plurality of continuous wavelength bands that are considered to be effective to some extent may be selected as the specific wavelength based on an optical simulation result or a comparison result with an external measurement device.

To eliminate the rising time until stable oscillation, the light source unit 31a (light source) may maintain a state in which it can stably oscillate, or may be started at the timing of a step before step S104 in consideration of the time until stabilization. Also, since the wavelength band of the illumination light from the light source unit 31a is wide, the wavelength band may be narrowed using a wavelength cut filter before the light is incident as diffracted light on the wavelength selector 80. For example, test light having a desired wavelength band can be generated by changing the combination of a short wavelength cut filter and a long wavelength cut filter. In addition, the wavelength of light that becomes incident on the wavelength selector 80 can finely be controlled using a wavelength cut filter whose transmission band continuously changes depending on the incident position of light.

In a conventional method of changing the intensity of a light source itself of a specific wavelength of a semiconductor laser that mixes a plurality of wavelengths to change the ratio of wavelengths in illumination light, since detection needs to be started after waiting for stabilization of the light source, a considerable time is needed. Since it is practically difficult to wait for a long time in a state in which the imprint material 9 is cured, the position of the detection target needs to be detected by performing imprint many times. However, in the method of selecting the wavelength by the wavelength selector 80, as in this embodiment, since the position of the detection target can be detected by switching the wavelength in several tens of ms, data (for example, the wavelength characteristic) can efficiently be acquired using time after imprint.

Also, the asymmetry of the mark shape sometimes changes between positions (for example, between shot regions) in the surface of the substrate 8. Hence, the wavelength (that is, the specific wavelength) of light used to detect the position of the mark as the detection target is preferably switched between positions in the surface of the substrate 8. In the conventional method of adjusting the output of each of the plurality of light sources (semiconductor lasers) included in the light source unit 31a, a considerable time is needed after the output of each light source is adjusted until the output stabilizes. It is therefore difficult to quickly switch the wavelength of light used to detect the position of the mark, and it may be disadvantageous in terms of throughput (productivity). On the other hand, in the position detector 3 according to this embodiment, since the wavelength of light used to detect the position of the mark can quickly be switched by the wavelength selector 80 (liquid crystal filter 81), it may be advantageous in terms of throughput. Also, when generating the wavelength characteristic (second information) as well, since the wavelength of test light can quickly be switched by the wavelength selector 80, the time needed to generate the wavelength characteristic can largely be shortened. If the time needed to generate the wavelength characteristic is shortened, positions of more marks can be detected in the same detection time. Hence, the time to generate the wavelength characteristic can be shortened for each position in the surface of the substrate 8. That is, it is possible to shorten the time to decide the specific wavelength for each position in the surface of the substrate 8.

As another method of shortening the wavelength characteristic generation time, a method of obtaining a part of necessary information by interpolation can be used. As a method of interpolation, a method of performing fitting using a result obtained by a simulation based on a model having the same structure as the test sample can be used. For example, if a simulation result as shown in FIG. 13B is obtained, a function for approximating FIG. 13B is calculated. Using the function as the initial function of the fitting function, a coefficient can be fitted using data obtained by actual measurement. Hence, a graph whose tendency is equal to that of the simulation result can be drawn. The detection error of a wavelength that is not actually measured is calculated from the graph. Also, a method of performing fitting not using a simulation result but by determining a fitting initial function based on an actual measurement result under a similar process condition in the past is effective. This can reduce the error for a measurement value even if the number of measurement points is decreased.

The wavelength characteristic can also be obtained by a simulation as described with reference to FIGS. 13A and 13B. The simulation may be executed by the controller 15 or may be executed using a computer connected to the controller 15. In the simulation, the fact that a deviation occurs between the wavelength characteristic obtained by the simulation and the actual wavelength characteristic if the asymmetrical shape of the mark changes needs to be taken into consideration. Such a deviation can cause an error in position information detected using the wavelength selection condition (specific wavelength) decided based on the wavelength characteristic.

A method of reducing the error that occurs due to this reason will be described. First, the wavelength characteristic is obtained for a plurality of models. The plurality of models are a plurality of models whose asymmetrical shapes (shape errors caused by manufacturing errors) are different from each other, and may be, for example, a plurality of models in which the thicknesses or tilts of stacked layers are different from each other. Next, the sensitivity of the detection error to the shape error is obtained for each wavelength based on the simulation result for each the plurality of models. Next, the sensitivities obtained for the plurality of models are added, and a plurality of wavelengths for which the sensitivities to the shape error are low are selected as wavelengths for detection.

The example shown in FIG. 13B is the result of performing a simulation assuming a state in which the mark 10 and the mark 11 have no alignment error (a state in which the position of the mark 10 and the position of the mark 11 match). Hence, a detection error=0 nm is an alignment error=0. When forming a test sample in step S103, a detection error may exist in the relative position between the mark 10 and the mark 11 detected by the position detector 3 because of the asymmetrical shape of the mark 11. Hence, an alignment error may also exist between the mold 7 and the shot region of the substrate 8 which are aligned based on the relative position between the mark 10 and the mark 11 detected by the position detector 3. If an alignment error exists, and the relative position between the mark 10 and the mark 11 is detected in that state using a plurality of wavelengths, a result of adding an offset amount corresponding to the alignment error to the graph shown in FIG. 13B is obtained.

To obtain the offset amount from the result detected by the position detector 3, it is necessary to know the correct relative position (alignment error) between the mark 11 and the mark 10. For this purpose, the alignment error in the test sample can be evaluated using an evaluation apparatus such as an overlay inspection apparatus. The controller 15 obtains a wavelength characteristic whose offset amount is corrected based on the wavelength characteristic obtained by the above-described method and an evaluation result obtained using the evaluation apparatus. If the simulation result shown in FIG. 13B is correct, the corrected wavelength characteristic can be similar to the simulation result.

For example, if the alignment error between the mark 11 of the substrate 8 and the mark 10 of the mold 7 is 100 nm when producing a test sample, the position of the detection error=0 nm in FIG. 13B is actually measured as a position with an offset of 100 nm. If the test sample is evaluated by an evaluation apparatus such as an overlay inspection apparatus, the overlay error (alignment error) is evaluated as 100 nm.

In the imprint apparatus 1 including the position detector 3 with the above-described configuration, the wavelength characteristic of the test sample can be obtained by steps S101 to S106 in the flowchart of FIG. 14. Here, as for the wavelength characteristic obtained by detecting the position information of the test sample by the position detector 3, the offset value can be corrected based on the evaluation result obtained using the evaluation apparatus such as an overlay inspection apparatus.

An additional explanation will be made concerning step S105. Like the wavelength characteristic shown in FIG. 13B, the detection error changes depending on the wavelength of light received by the detector 33. The controller 15 decides the wavelength selection condition by the wavelength selector 80, more specifically, the specific wavelength (wavelength band) to be selected by the wavelength selector 80 such that the detection error of the position detector 3 (the error of position information detected by the position detector 3) is reduced.

An example of control for selecting a wavelength, by the liquid crystal filter 81 serving as the wavelength selector 80, from illumination light generated by a white light laser light source (super continuum light source) forming the light source unit 31a will be described below. The liquid crystal filter 81 serving as the wavelength selector 80 is formed by a plurality of pixels (for example, 640×480 pixels) two-dimensionally arrayed on the incident surface 80a on which diffracted light is incident, and can individually turn on or off the pixels. That is, on the incident surface 80a of the liquid crystal filter 81, the pixels are ON/OFF-controlled such that a light beam is transmitted through pixels arranged at positions where light of a specific wavelength is incident, but not transmitted through pixels arranged at remaining positions.

Figure 15:
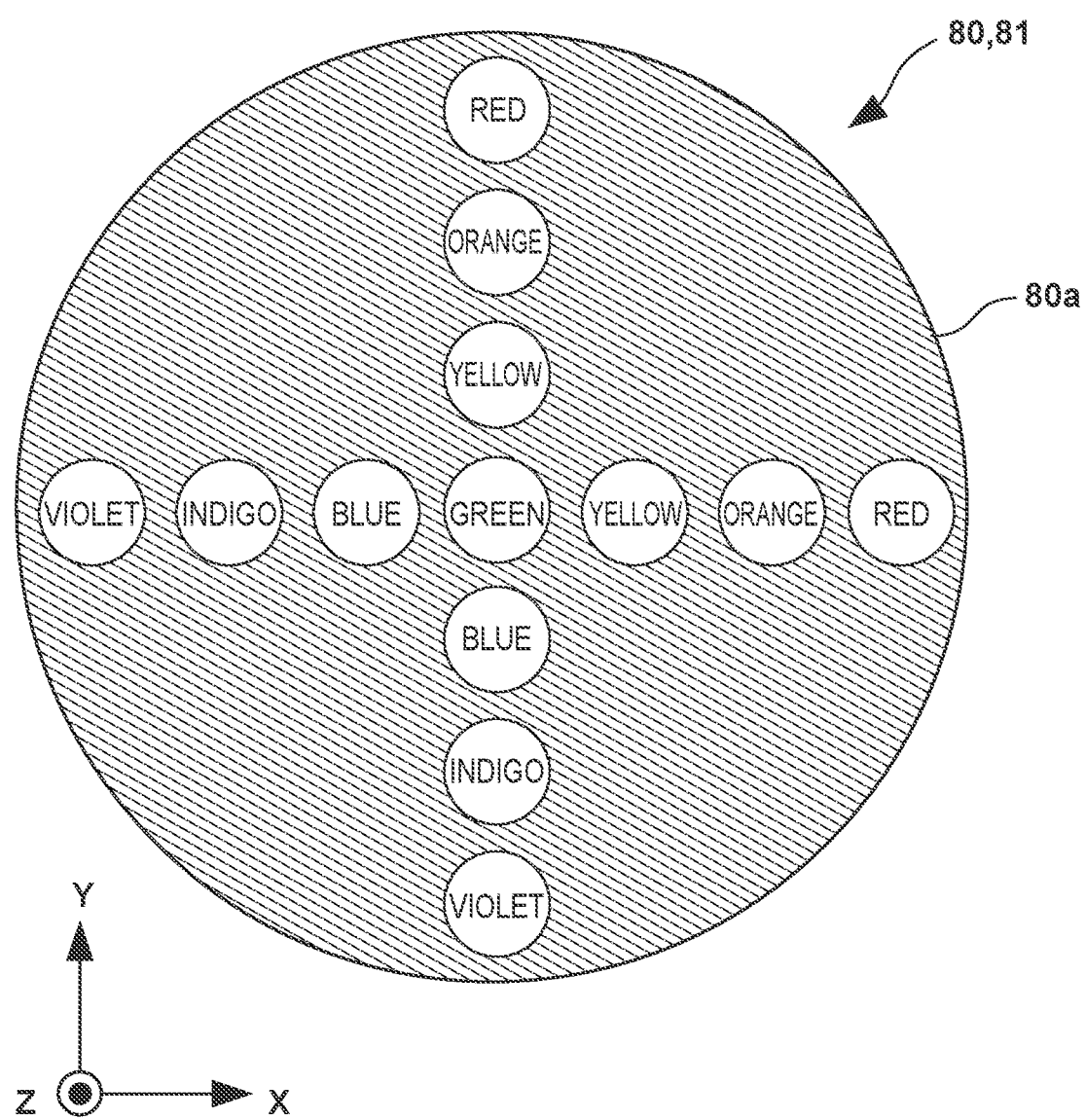
FIG. 15 is a view showing the wavelength distribution (color distribution) of light that is incident on the incident surface of a liquid crystal filter.

As described above, since the liquid crystal filter 81 (wavelength selector 80) is arranged on the Fourier transform surface with respect to the positions of the mark 10 and the mark 11, light of a different wavelength reaches in accordance with the position in the incident surface 80a. FIG. 15 schematically shows, on the X-Y plane, the wavelength distribution (color distribution) of light that is incident on the incident surface 80a of the liquid crystal filter 81. Light reaching the incident surface 80a of the liquid crystal filter 81 is incident at a different position on the incident surface 80a in accordance with the value of the wavelength k. For this reason, the wavelength of light to be transmitted through the liquid crystal filter 81 and guided to the detector 33 can be selected by selecting whether to transmit or block light for each position on the incident surface 80a of the liquid crystal filter 81. Also, in the liquid crystal filter 81, the wavelength band to be guided to the detector 33 can be selected discretely or continuously by setting whether to separate to continue the region to transmit light, as shown in FIGS. 6A and 6B. FIG. 6A shows an example in which light of one continuous wavelength band is selected, and FIG. 6B shows an example in which a plurality of (two) wavelength bands apart from each other are selected.

As described above, the position detector 3 according to this embodiment includes the wavelength selector 80 with the incident surface 80a on which a plurality of elements for switching light guide/nonguide of diffracted light to the detector 33 are two-dimensionally arrayed. The wavelength selector 80 controls each of the plurality of elements in the wavelength selector 80 in accordance with the position where the specific wavelength is incident on the incident surface 80a, thereby selecting light of the specific wavelength from diffracted light and guiding it to the detector 33. The position detector 3 including the wavelength selector 80 can quickly switch the wavelength in accordance with the position on the substrate where the detection target is provided. This can be advantageous in terms of throughput (productivity) as compared to the conventional configuration in which a wavelength is selected by changing the output of the light source unit 31a.

Second Embodiment

The second embodiment according to the present invention will be described. In the first embodiment, an example in which the liquid crystal filter 81 is used as the wavelength selector 80 has been described. In the second embodiment, an example in which an optical device in which a plurality of elements (pixels) for switching reflection/non-reflection of diffracted light are two-dimensionally arrayed on an incident surface 80a is used as a wavelength selector 80 will be described. As the optical device, a digital mirror device (DMD) 82 can be used. Note that the second embodiment basically takes over the first embodiment, and is the same as described in the first embodiment except matters to be described below.

In a position detector 3 according to this embodiment, as shown in FIG. 3, the digital micromirror device (DMD) 82 is used in place of an aperture stop 36 of a detection optical system 32, and the DMD 82 can function as the wavelength selector 80. The DMD 82 is formed by a plurality of, for example, 640×480 elements (devices or mirrors), and reflection and non-reflection of diffracted light can be switched in each element. This makes it possible to select whether to guide a light beam to a detector 33 for each element of the DMD 82. If the DMD 82 is used as the wavelength selector 80, the diffraction efficiency is higher as compared to a case where a liquid crystal filter 81 is used. In the configuration shown in FIG. 3, the DMD 82 is arranged on a Fourier transform surface with respect to the surface of a substrate 8, and light reflected by the DMD 82 is guided to the detector 33 (image capturing device).

Figure 16A:
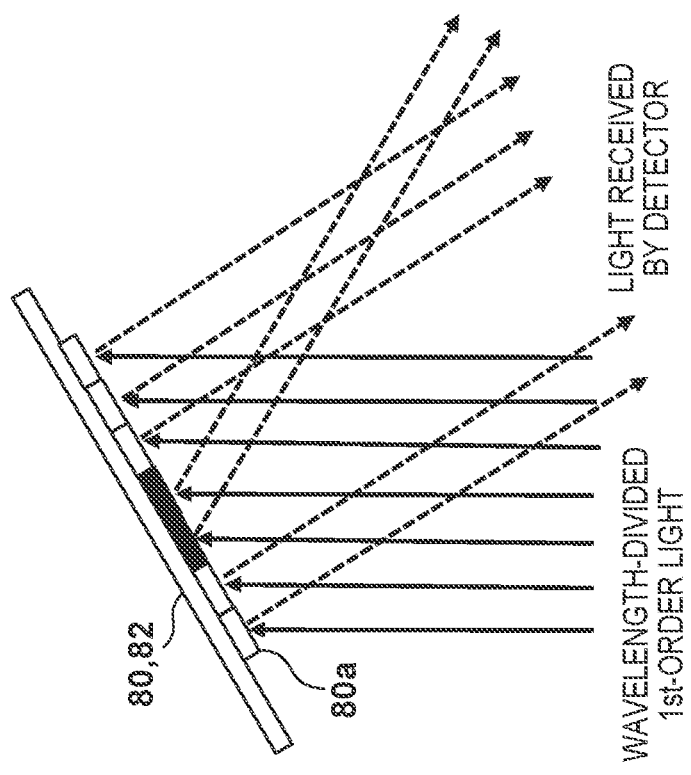
FIGS. 16A and 16B are views for explaining wavelength selection by a wavelength selector (DMD)
Figure 16B:
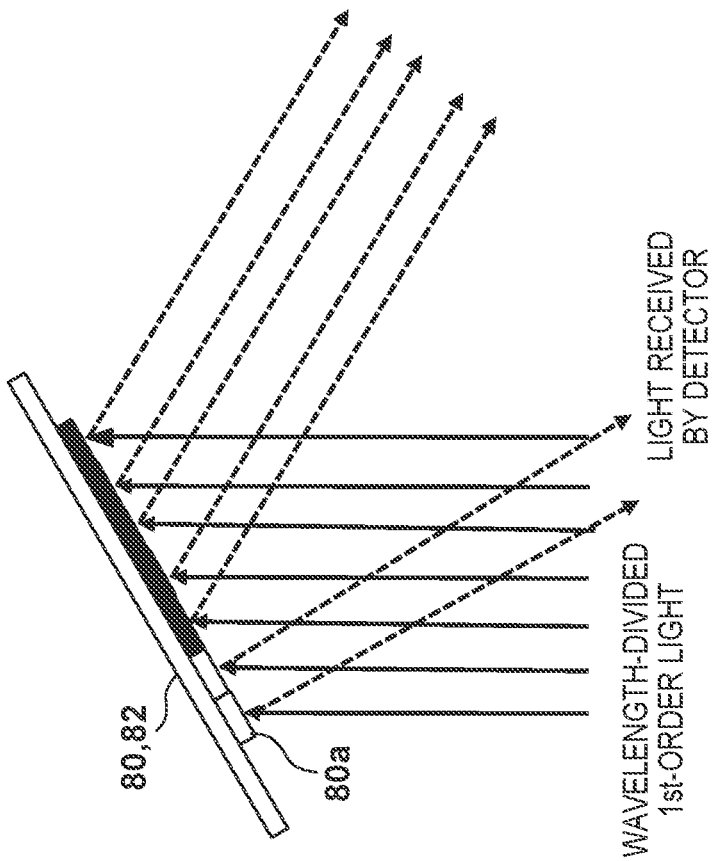

Wavelength division of illumination light will be described here with reference to FIGS. 4A and 4B. As in the first embodiment, 1st-order light of illumination light diffracted/wavelength-divided by a mark 10 and a mark 11 is incident on the DMD 82, as shown in FIGS. 4A and 4B. Since the DMD 82 is arranged on the Fourier transform surface, light components that are incident on the DMD 82 are incident at positions different from each other on the incident surface 80a in accordance with the wavelength. Hence, as shown in FIGS. 16A and 16B, when the state of each element of the DMD 82 is controlled, light of a specific wavelength can be selected from diffracted light and guided to the detector 33. Under the control of a controller 15, the DMD 82 selects whether to guide incident light to the detector 33 for each element (mirror) of the DMD 82.

The DMD 82 can change the optical path of reflected light by changing the direction of a mirror as an element. For this reason, in the DMD 82 serving as the wavelength selector 80, the wavelength band to be guided as a specific wavelength to the detector 33 can be selected discretely or continuously by setting whether to separate to continue the region to reflect light and guide it to the detector 33, as shown in FIGS. 16A and 16B. FIG. 16A shows an example in which light of one continuous wavelength band is selected and guided to the detector 33, and FIG. 16B shows an example in which a plurality of (two) wavelength bands apart from each other are selected and guided to the detector 33.

As described above, in this embodiment, the DMD 82 is used as the wavelength selector 80. Similarly to the first embodiment, according to this embodiment as well, wavelength switching can quickly be performed in accordance with the position on the substrate where the detection target is provided. This can be advantageous in terms of throughput (productivity) as compared to the conventional configuration in which a wavelength is selected by changing the output of a light source unit 31a.

<Embodiment of Article Manufacturing Method>

An article manufacturing method according to the embodiment of the present invention is suitable for manufacturing an article, for example, a microdevice such as a semiconductor device or a device having a microstructure. The article manufacturing method according to this embodiment includes a detection step of, using a mark provided on a substrate as a detection target, detecting the position of the mark using the above-described position detector 3, and a positioning step of positioning the substrate based on the detection result in the detection step. Also, the article manufacturing method according to this embodiment includes a processing step of processing the substrate positioned in the positioning step, and a manufacturing step of manufacturing an article from the substrate processed in the processing step. The processing step may include a step of forming a pattern on the substrate by the above-described lithography apparatus (imprint apparatus 1). Furthermore, the manufacturing method includes other well-known steps (for example, oxidization, deposition, vapor deposition, doping, planarization, etching, resist removal, dicing, bonding, packaging, and the like). The article manufacturing method according to this embodiment is superior to a conventional method in at least one of the performance, quality, productivity, and production cost of the article.

If the imprint apparatus is used as the lithography apparatus, the pattern of a cured product formed using the imprint apparatus is used permanently for at least some of various kinds of articles or temporarily when manufacturing various kinds of articles. The articles are an electric circuit device, an optical device, a MEMS, a recording device, a sensor, a mold, and the like. Examples of the electric circuit device are volatile or nonvolatile semiconductor memories such as a DRAM, an SRAM, a flash memory, and an MRAM and semiconductor devices such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 17A:
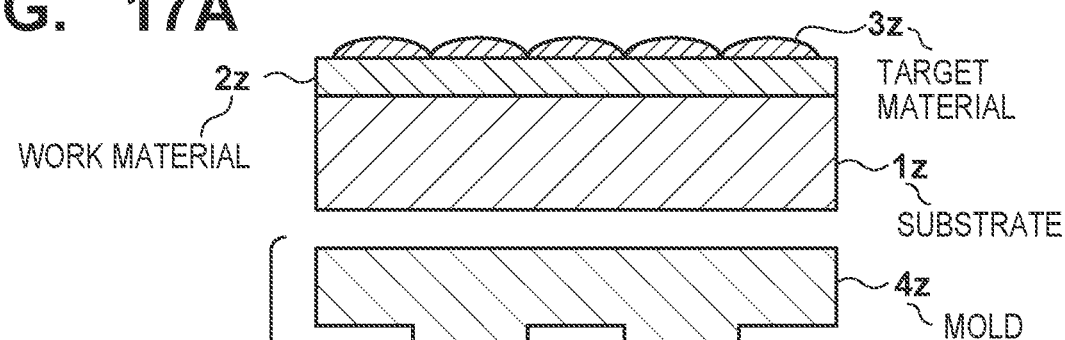
FIGS. 17A to 17F are views for explaining an article manufacturing method.

A detailed method of manufacturing an article will be described next. As shown in FIG. 17A, a substrate 1z such as a silicon wafer with a target material 2z to be processed such as an insulator formed on the surface is prepared. Next, an imprint material 3z is applied to the surface of the target material 2z by an inkjet method or the like. A state in which the imprint material 3z is applied as a plurality of droplets onto the substrate is shown here.

Figure 17B:
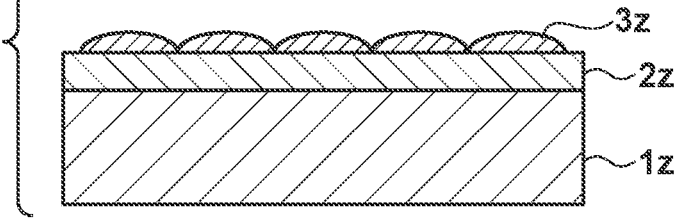
Figure 17C:
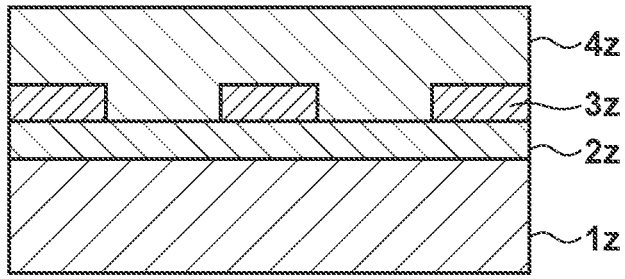

As shown in FIG. 17B, a side of a mold 4z for imprint, where a pattern with convex and concave portions is formed, is directed to face the imprint material 3z on the substrate. As shown in FIG. 17C, the mold 4z and the substrate 1z to which the imprint material 3z is applied are brought into contact with each other, and a pressure is applied. The gap between the mold 4z and the target material 2z is filled with the imprint material 3z. In this state, by irradiating the imprint material 3z with energy for curing through the mold 4z, the imprint material 3z is cured.

Figure 17D:
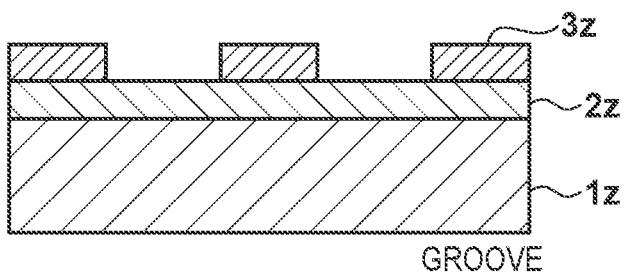

As shown in FIG. 17D, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the pattern with convex and concave portions in the mold 4z is transferred to the imprint material 3z.

Figure 17E:
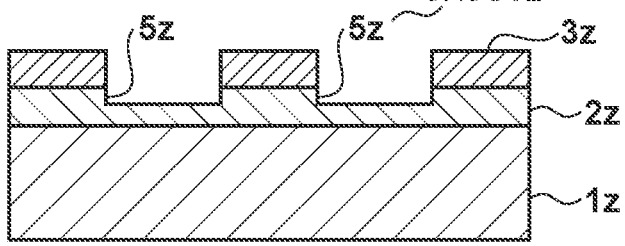
Figure 17F:
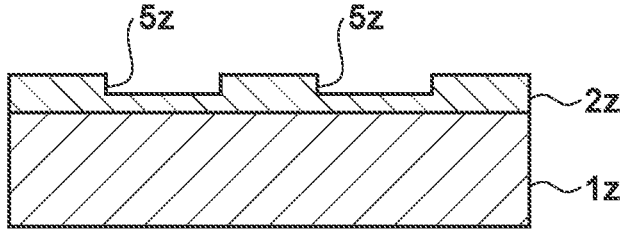

As shown in FIG. 17E, by performing etching using the pattern of the cured product as an etching resistant mask, a portion of the surface of the target material 2z where the cured product does not exist or remains thin is removed to form a groove 5z. As shown in FIG. 17F, by removing the pattern of the cured product, an article with the grooves 5z formed in the surface of the target material 2z can be obtained. Here, the pattern of the cured product is removed. However, instead of removing the pattern of the cured product after processing, it may be used as, for example, an interlayer dielectric film included in a semiconductor device or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-206257 filed on Dec. 20, 2021, which is hereby incorporated by reference herein in its entirety.

What is claimed is:

1. A detection apparatus for detecting a position of a detection target including a diffraction grating pattern, the detection apparatus comprising:
   an illuminator configured to illuminate the detection target with illumination light including a plurality of wavelengths;
   a wavelength selector including an incident surface on which diffracted light from the detection target illuminated by the illuminator is incident, and configured to select light of a specific wavelength from the diffracted light; and
   a detector configured to receive the light of the specific wavelength selected by the wavelength selector and detect the position of the detection target,
   wherein the wavelength selector includes a plurality of elements, each configured to switch light guide/nonguide of the diffracted light to the detector, two-dimensionally arrayed on the incident surface of the wavelength selector,
wherein diffraction directions of light components of the plurality of wavelengths included in the illumination light on the detection target are different from each other, and positions on the incident surface of the wavelength selector where the light components are incident as the diffracted light are different from each other, and
wherein the wavelength selector;
  decides the specific wavelength based on information about a wavelength characteristic representing a relationship between each of the plurality of wavelengths and a detection error in the detector, so that the detection error is reduced, and
  selects the light of the decided specific wavelength from the diffracted light and guides the light to the detector, by controlling each of the plurality of elements in accordance with the position on the incident surface where the light of the decided specific wavelength is incident.

2. The apparatus according to claim 1, further comprising:
a lens disposed between the wavelength selector and the detection target,
wherein the lens is configured to make the light components of the plurality of wavelengths diffracted by the detection target incident at positions different from each other on the incident surface.

3. The apparatus according to claim 1, wherein the wavelength selector includes an optical device configured to switch transmission/non-transmission of the diffracted light in each of the plurality of elements.

4. The apparatus according to claim 1, wherein the wavelength selector includes an optical device configured to switch reflection/non-reflection of the diffracted light in each of the plurality of elements.

5. The apparatus according to claim 1, wherein the illuminator obliquely illuminates the detection target with the illumination light.

6. The apparatus according to claim 1, wherein the wavelength selector controls each of the plurality of elements based on first information representing a relationship between each of the plurality of wavelengths and an incident position on the incident surface so that the light of the specific wavelength is selected from the diffracted light and guided to the detector.

7. The apparatus according to claim 1, wherein the wavelength selector generates the information about the wavelength characteristic by obtaining the detection error in the detector while changing a wavelength selected from the plurality of wavelengths.

8. The apparatus according to claim 1, wherein
the detection target includes a plurality of regions in which a position is detected by the detection apparatus, and
the wavelength selector changes the specific wavelength between the plurality of regions.

9. The apparatus according to claim 1, wherein:
the illuminator obliquely illuminates the detection target with the illumination light, and
the diffracted light incident on the incident surface of the wavelength selector is 1st-order diffracted light diffracted by the detection target.

10. The apparatus according to claim 9, wherein 0th-order reflected light from the detection target is not incident on the incident surface of the wavelength selector.

11. A lithography apparatus for forming a pattern on a substrate, the lithography apparatus comprising:
a detection apparatus configured to, using a mark provided on a substrate as a detection target, detect a position of the mark; and
a mechanism configured to position the substrate based on a detection result of the detection apparatus,
wherein the detection apparatus comprises:
  an illuminator configured to illuminate the detection target with illumination light including a plurality of wavelengths;
  a wavelength selector including an incident surface on which diffracted light from the detection target illuminated by the illuminator is incident, and configured to select light of a specific wavelength from the diffracted light; and
  a detector configured to receive the light of the specific wavelength selected by the wavelength selector and detect the position of the detection target,
  wherein the wavelength selector includes a plurality of elements, each configured to switch light guide/nonguide of the diffracted light to the detector, two-dimensionally arrayed on the incident surface of the wavelength selector,
  wherein diffraction directions of light components of the plurality of wavelengths included in the illumination light on the detection target are different from each other, and positions on the incident surface of the wavelength selector where the light components are incident as the diffracted light are different from each other, and
  wherein the wavelength selector:
    decides the specific wavelength based on information about a wavelength characteristic representing a relationship between each of the plurality of wavelengths and a detection error in the detector, so that the detection error is reduced; and
    selects the light of the decided specific wavelength from the diffracted light and guides the light to the detector, by controlling each of the plurality of elements in accordance with the position on the incident surface where the light of the decided specific wavelength is incident.

12. An article manufacturing method comprising:
detecting a position of a mark provided on a substrate as a detection target using a detection apparatus;
positioning the substrate based on a detection result in the detecting;
processing the substrate positioned in the positioning; and
manufacturing an article from the substrate processed in the processing,
wherein the detection apparatus comprises:
  an illuminator configured to illuminate the detection target with illumination light including a plurality of wavelengths;
  a wavelength selector including an incident surface on which diffracted light from the detection target illuminated by the illuminator is incident, and configured to select light of a specific wavelength from the diffracted light; and
  a detector configured to receive the light of the specific wavelength selected by the wavelength selector and detect the position of the detection target,
  wherein the wavelength selector includes a plurality of elements, each configured to switch light guide/ nonguide of the diffracted light to the detector, two-dimensionally arrayed on the incident surface of the wavelength selector, wherein diffraction directions of light components of the plurality of wavelengths included in the illumination light on the detection target are different from each other, and positions on the incident surface of the wavelength selector where the light components are incident as the diffracted light are different from each other, and wherein the wavelength selector:
  decides the specific wavelength based on information about a wavelength characteristic representing a relationship between each of the plurality of wavelengths and a detection error in the detector, so that the detection error is reduced; and
  selects the light of the decided specific wavelength from the diffracted light and guides the light to the detector, by controlling each of the plurality of elements in accordance with the position on the incident surface where the light of the decided specific wavelength is incident.

* * * * *